United States Patent [19]

Oguey et al.

[11] 4,140,924
[45] Feb. 20, 1979

[54] LOGIC CMOS TRANSISTOR CIRCUITS

[75] Inventors: Henri J. Oguey, Corcelles; Eric A. Vittoz, Cernier, both of Switzerland

[73] Assignee: Centre Electronique Horloger S.A., Neuchatel, Switzerland

[21] Appl. No.: 748,287

[22] Filed: Dec. 7, 1976

[30] Foreign Application Priority Data

Dec. 10, 1975 [CH] Switzerland .................. 16029/75

[51] Int. Cl.² ................. H03K 21/10; H03K 23/24; H03K 19/08; H03K 3/286
[52] U.S. Cl. ..................... 307/225 C; 307/205; 307/221 C; 307/224 C; 307/279; 307/DIG. 5
[58] Field of Search ........... 307/205, 213, 215, 220 C, 307/221 C, 224 C, 225 C, 279

[56] References Cited

U.S. PATENT DOCUMENTS

| | | | |
|---|---|---|---|
| 3,619,644 | 11/1971 | Vittoz | 307/225 C |
| 3,619,646 | 11/1971 | Vittoz | 307/205 X |
| 3,653,034 | 3/1972 | Regitz | 307/205 X |
| 3,760,580 | 9/1973 | Fujita | 307/225 C X |
| 3,829,714 | 8/1974 | Vittoz | 307/225 C |
| 3,911,428 | 10/1975 | Chin | 307/205 X |
| 3,928,773 | 12/1975 | Oguey et al. | 307/225 C |
| 4,057,741 | 11/1977 | Piguet | 307/221 C X |

FOREIGN PATENT DOCUMENTS 583483 12/1976 Switzerland .................. 307/225 C

OTHER PUBLICATIONS

Oguey et al., "CODYMOS Frequency Dividers Achieve Low/Power Consumption and High Frequency", *Electronic Letters* (pub.); pp. 386-387, 8/23/73.

*Primary Examiner*—Larry N. Anagnos
*Attorney, Agent, or Firm*—Cushman, Darby & Cushman

[57] ABSTRACT

The invention relates to logic CMOS transistor circuits formed by at least one gate circuit, each gate circuit comprising a pair of CMOS transistor groups connected in series between the terminals of a power supply. The conductive state of both groups of transistors defines the potential of a common connection point or output node. A power dissipating means of relatively high resistance is coupled in parallel with at least a part of at least one of the said transistor groups, at least during a time interval in which both groups are in a non conductive state. This results in a quasi static behavior of the circuits according to the invention although the basic structure of the same is that of dynamic circuits.

19 Claims, 25 Drawing Figures

LOGIC CMOS TRANSISTOR CIRCUITS

The present invention relates to logic circuits and in particular to new and improved logic circuits which employ complementary MOS transistors.

Among known logic circuits employing complementary MOS transistors one can distinguish between so-called static and dynamic circuits. Static circuits are circuits the structure of which is directly derived from the corresponding logical equations, as described for instance in the book of N. Carr and J. P. Mize "MOS/LSI Design and Application" McGraw-Hill Book Co., 1972, Ch. 4. In particular, static binary frequency divider circuits are known from Swiss Pat. No. 524,933. Dynamic circuits are circuits which comprise only those transistors which participate in the commutations and in which certain logic states of a node are only maintained through the parasitic capacitance appearing at this node (U.S. Pat. Nos. 3,267,295 and 3,551,693). For instance, dynamic frequency divider circuits are known from U.S. Pat. No. 3,928,773 Swiss Pat. No. 561,986, the article of H. Oguey and E. Vittoz "CODY-MOS frequency dividers achieve low power consumption and high frequency" in Electronics Letters of Aug. 23, 1973, Vol. 9, No. 17, p. 386 and 387, and from Swiss Pat. No. 566.092.

Static logic circuits have the advantage of operating within the whole frequency range from 0 to upper limit $f_{max}$ determined by the gain of the transistors and the parasitic capacitances. The drawback of those circuits is their relatively complex structure. Dynamic circuits are much more simple in design, they are faster, use less power, take less place and are cheaper to make. The drawback of dynamic circuits resides in the fact that their operation is assured only if the duration between two transitions of the control signals is comprised between a lower limit $T_{min}$ and an upper limit $T_{max}$. Dynamic circuits cannot be used at low frequencies.

The present invention relates to logic circuits which can be considered as being of the same family as the said dynamic circuits in as far as both of a pair of transistor groups comprised in a same logic gate therof can be simultaneously brought into a non conductive state in at least one combination of the input variables.

It is a first object of the invention to provide logic circuits which on the one hand retain the mentioned advantages of the dynamic circuits and which on the other hand show a static or semi-dynamic behaviour, i.e. are not subject to the same restrictions in operation as the dynamic circuits. A semi-dynamic behaviour means that the repetition frequency of the input signals of the circuit can be as low as desired provided that the duration of one of the states of such signal is sufficiently short.

A logic circuit according to the invention comprises at least one gate circuit formed by a first group of n channel MOS transistors and a second group of p channel MOS transistors, each group defining a conduction path, the conduction paths of the said first and second groups having a common connection point constituting the output node of the gate circuit. Said first and second groups of transistors are further respectively connected to the negative and positive terminals of a power supply means and the said MOS transistors are each connected for control by at least one logic control variable represented by a voltage capable of taking two predetermined values, the conductive state of each of the said first and second groups of transistors defining the potential of the output node which represents the output variable of the gate circuit. According to the invention in at least one combination of the control variables a power dissipating means is coupled in parallel with at least part of at least one of the said groups of transistors to define at least temporarily a conduction path between the output node of the gate circuit including the said group and one terminal of the power supply means. The resistance of the power dissipating means is high with respect to that of a MOS transistor in its conductive state but is less than $V_{T\,min}/I_{f\,max}$, $V_{T\,min}$ being the minimum threshold voltage of the transistors and $I_{f\,max}$ being the maximum leakage current at the considered output node. This results in the potential of the said output node being substantially equal to that of the said power supply terminal during the time interval in which both said first and second groups of transistors of the gate circuit are in the non conductive state.

Another object of the invention is to provide various decoding circuits, frequency dividers, D flip-flop circuits and shift register circuits making use of the general circuit arrangement defined above and allowing to considerably reduce the total number of components, to simplify the means for connecting these components and to thereby reduce the size and cost of those circuits.

In a logic circuit according to the invention the group of transistors opposite the group comprising the power dissipating element includes at least one auxiliary transistor which is controlled so as to establish for a predetermined duration a conduction path between the output node of the logic gate concerned and the corresponding terminal of the power supply, the impedance of the said conductive path being substantially less than that of the dissipating element.

The dissipating element can be coupled in parallel to at least a part of one or more transistor groups through auxiliary transistors which are controlled by appropriately chosen logic variables.

The power dissipating element or means can be constituted in particular by a resistor made of weakly doped polysilicon, by a diode formed by a pn junction between two layers of strongly doped polysilicon or by a pn junction between two highly doped regions of a monosilicon wafer, by a low gain MOS transistor biased in the forward direction, by a weakly biased MOS transistor operating as a current source or by a depletion mode MOS transistor the gate of which is connected to its source.

The accompanying drawing represents by way of example various embodiments of logic circuits according to the invention.

FIG. 6a is a circuit diagram of a frequency divider comprising two divider by two stages and FIG. 6b is a simplified diagram of the first stage of the divider circuit of FIG. 6a;

FIG. 7 is a time-chart of the logic variables appearing in the circuit of FIG. 6a;

A first embodiment of a logic circuit according to the invention is a decoding circuit, that is a circuit designed for decoding defined logic sequences. In other words such circuit is capable of detecting specific states within a sequence wherein all states appear in an order known by advance, such as in particular in the case of the signals delivered by a binary counting chain.

Figure 1:
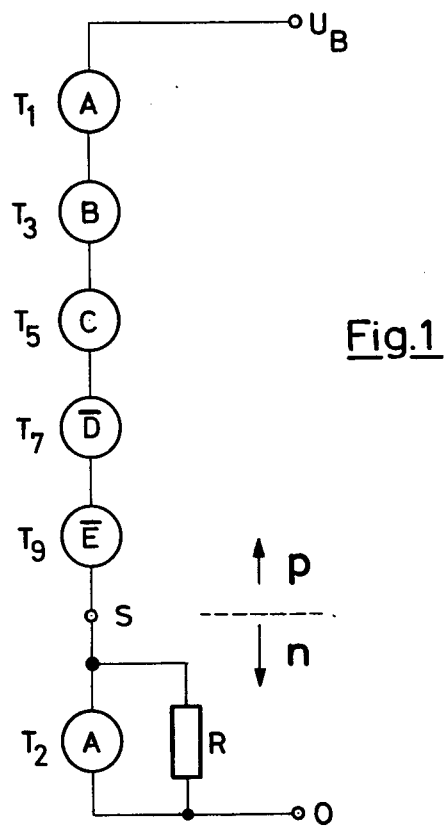
FIG. 1 is a schematic diagram of a decoder circuit with a single output.

The logic gate circuit represented in FIG. 1 constitutes a decoder having a single output and allowing to detect a predetermined state of a binary counter. In the diagram of FIG. 1 MOS transistors $T_1$, $T_2$, $T_3$, $T_5$, $T_7$ and $T_9$ are symbolized by circles the connections of which are those of the drain and source electrodes of the corresponding transistors.

The transistors with odd indices are p channel transistors and constitute a first group of transistors in which the source of $T_1$ is connected to the positive terminal ($U_B$) of a power supply, the drain of $T_1$ is connected to the source of $T_3$, the drain of $T_3$ is connected to the source of $T_5$, etc.

Transistor $T_2$ is of n channel type and stands in this embodiment for a second group of transistors forming with the first group the said logic gate circuit. The source of $T_2$ is connected to the negative terminal (0) of the power supply and its drain is connected to that of transistor $T_9$. The common connection point of the transistors of the first and second groups constitute the output node S of the gate.

Furthermore a power dissipating element represented by a resistor R of a high value is connected in parallel with the drain source path of transistor $T_2$. The conditions to which the value of this resistor has to satisfy and different examples of realization of such a dissipating element will be explained later on.

The input variables or control variables of this logic circuit are voltages applied to the gates of the different transistors, which voltages can take two predetermined values or levels bringing the corresponding transistor respectively in the "on"-state (conductive state) or in the "off"-state (non conductive state). The control variables are represented in the diagram of FIG. 1 by characters inside the circles which symbolize the transistors.

Figure 2:
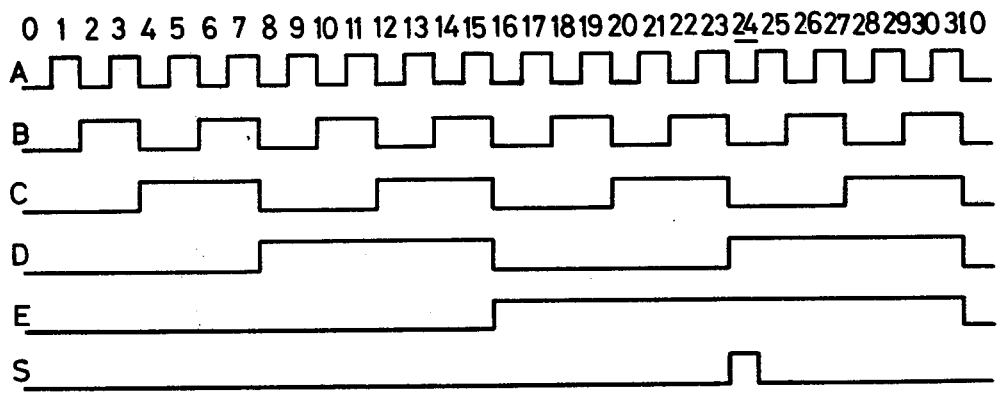
FIG. 2 is a time-chart of logic signals associated with the circuit of FIG. 1.

FIG. 2 shows the variation of logic signals A to E as a function of time, which logic signals correspond save in polarity to input variables A, B, C, D̄ and E delivered to the circuit by a binary counter. As usual, the strokes upon letters mean that the signal is applied in its complementary form, i.e. with opposed polarity. The output variable appearing at the output node of the circuit is represented at line S of FIG. 2.

Signals A to E define together 32 different states which have been numbered in FIG. 2 from 0 to 31. As the transistors of the first group are of the p channel type and conduct when the indicated input variables appear in the opposed state, it results from the diagram of FIG. 1 that for each of the states 0 to 23 and 25 to 31 at least one transistor of the first group is turned off. In state 24 however all transistors of this group are in the conductive state.

On the other hand the n channel transistor $T_2$ conducts with the corresponding input variable being at the 1 level. This transistor is thus alternatively cut off and conducting in the successive states 0 to 31.

When transistor $T_2$ is cut-off simultaneously with the first group of transistors, the output node S is maintained at the potential of the negative terminal of the power supply due to the presence of resistor R. The potential of the output node is thus defined independently of the duration of the simultaneous non conducting condition of both groups of transistors, which means that the circuit has static behaviour.

In state 24 of the logic signals transistor $T_2$ is turned off while all transistors of the first group are conducting. During this state the output node S has therefore a potential which is approximately equal to $U_B$. In the following state the potential of the output node is brought back to that of the negative terminal through the conduction of $T_2$ and it is maintained at this value (0) by the resistor R until state 24 appears anew. The logic gate thus operates as a decoder of state 24 among the states 0 to 31 defined by the signals A to E.

Compared to the conventional solution for realizing a decoder of this type which consists in employing a NOR gate with five inputs, the present solution amounts to replacing four n channel transistors by one dissipating element R. For N variables this allows to save N-1 transistors which corresponds with respect to the total number 2N of transistors required in the conventional solution to a ratio of N-1/2N, which ratio approaches 50% for great numbers N.

In the case of decoders with a plurality of outputs, the present circuit allows particularly significant savings in the number of transistors and in the surface of the integrated circuit.

Figure 3:
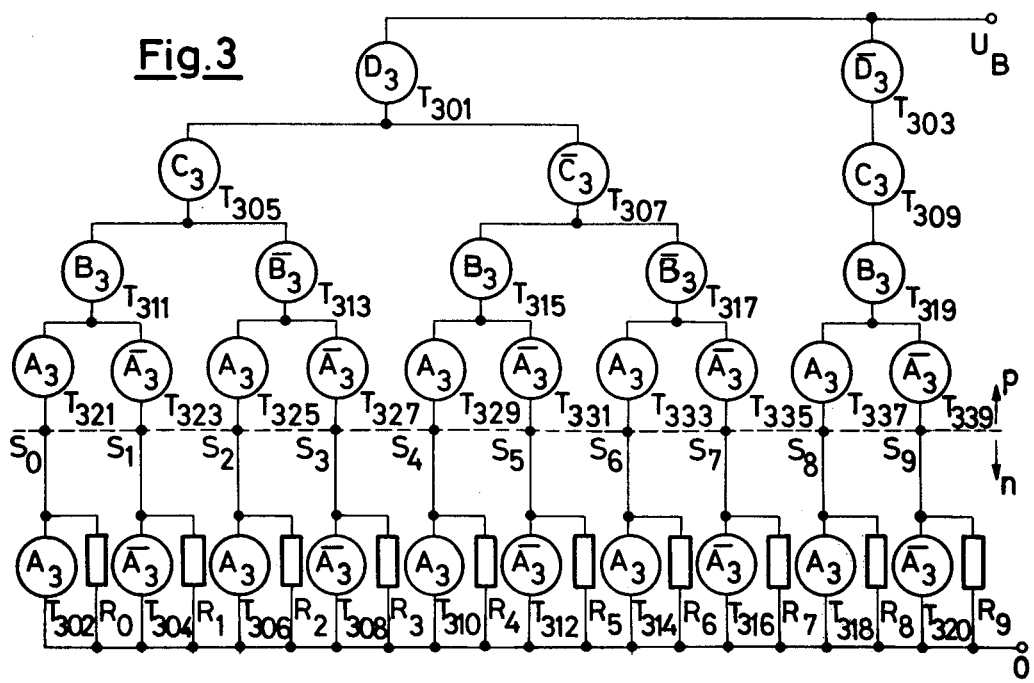
FIG. 3 is a schematic diagram of a binary-to-decimal decoder circuit.

As an example FIG. 3 represents a binary-to-decimal decoder combining a number of logic gates of the above-mentioned type. The symbolism used in FIG. 3 is the same as in FIG. 1. The whole circuit comprises 30 transistors $T_i$ (i = 301, 302, 303, ..., 321, 323, 325, 327, 329, 331, 333, 335, 337, 339) and 10 dissipating elements $R_0$ to $R_9$. By way of comparison the usual method using C-MOS technology would require 60 transistors for the same purpose.

The circuit of FIG. 3 is formed of 10 logic gates having each a first group of p channel transistors designated by uneven indices for instance $T_{301}$, $T_{305}$, $T_{311}$ and $T_{321}$ and a n channel transistor with even index for instance $T_{302}$, the conduction path of these transistors being connected in series between the positive terminal ($U_B$) and the negative terminal (0) of a power supply. The connection points of the p transistors and the corresponding n transistors formed the output nodes $S_0$ to $S_9$ of the circuit. As shown in the diagram of FIG. 3, 10 p channel transistors are common to two or more logic gates, for instance $T_{301}$ makes part of the eight gates the output nodes of which are $S_0$ to $S_7$, and $T_{303}$ participates in the control of $S_8$ and $S_9$, $T_{305}$ correspondingly influences $S_0$ to $S_3$, $T_{311}$ influences $S_0$ and $S_1$ and so on. Thus for instance the logic gate with the output node $S_2$ is formed by $T_{301}$, $T_{305}$, $T_{313}$, $T_{325}$ and $T_{306}$. The dissipating elements $R_0$ to $R_9$ are connected in parallel to the conduction path of the corresponding n transistors so as to maintain the potential of the corresponding output node at 0 when both groups of transistors connected to this node are simultaneously in the non conductive state.

Figure 4:
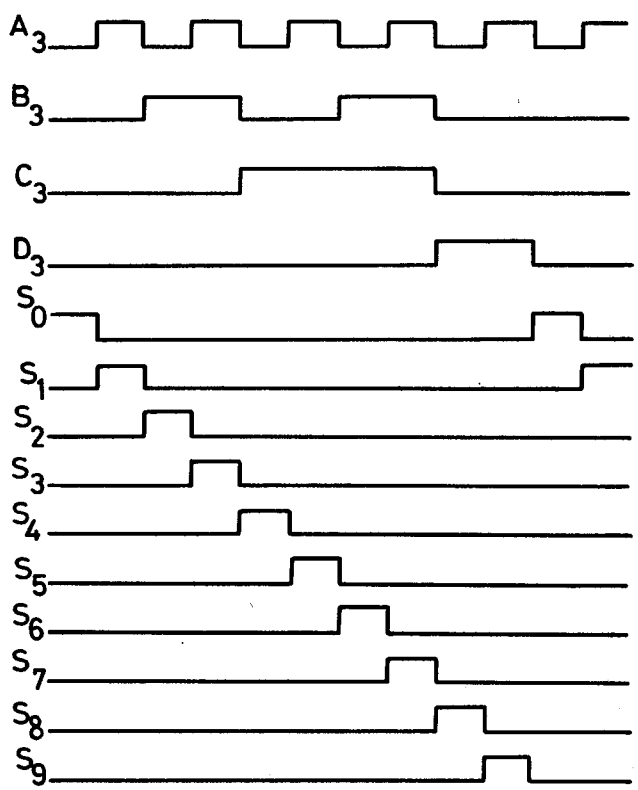
FIG. 4 is a time-chart of logic signals associated with the circuit of FIG. 3.

FIG. 4 shows the logic signals $A_3$ to $D_3$ corresponding to the input variables $A_3$, $\overline{A}_3$, $B_3$, $\overline{B}_3$, $C_3$, $\overline{C}_3$, $D_3$, $\overline{D}_3$ as well as the output variables $S_0$ to $S_9$ delivered by the output nodes of the same name. It is easy to check by applying the same rules and the same symbolism as in the foregoing description and by considering the association of input variables with the various transistors as shown in FIG. 3, that the 10 successive states formed by signals $A_3$ to $D_3$ correspond to output signals appearing successively at the output nodes $S_0$ to $S_9$. Thus a binary-decimal decoder is provided which allows to save half of the transistors required in the usual circuit and which still shows a static behaviour. Moreover the present circuit allows to eliminate some of the connections which are necessary in the conventional circuit. This is due to the fact that only the p transistors are controlled by all of the eight input variables while the n transistors are only controlled by $A_3$ and $\overline{A}_3$. This represents an additional saving in surface for the integrated circuit.

The power dissipating elements which make part of the present circuits can be realized in various manners and the choice thereof depends mainly on the technology used. FIGS. 5a, 5b, 5c and 5d show by way of example three types of dissipating elements. The logic gate to which the elements are coupled includes two groups of transistors, $G_p$ and $G_n$, not shown in detail, which are connected on both sides of an output node S between the terminals $U_B$ and 0 of a power supply. The connection of the power dissipating element is shown only schematically, this element being coupled as a general rule in parallel with at least one part of one of the transistor groups.

Figure 5A:
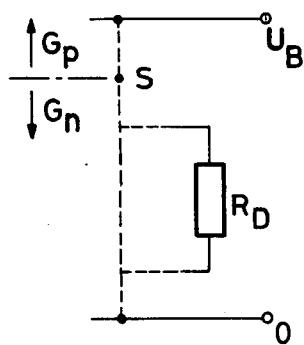
FIGS. 5a to 5d represent schematically examples of realization of a power dissipating element as used in the present invention.

In FIG. 5a the dissipating element is a resistor $R_D$ made for instance with weakly doped polysilicon.

Figure 5B:
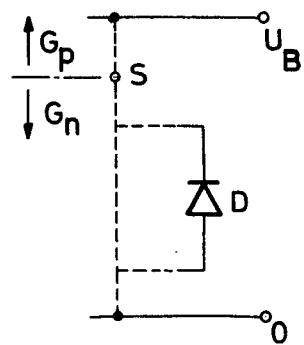

In FIG. 5b the dissipating element is a diode D formed by a pn junction biased in blocking direction and the leakage current of which is much higher than the total leakage current of the off-biased transistors of the group $G_p$ opposite to the group comprising the diode D. The pn junction can be a junction between two layers of strongly doped polysilicon such as described in the U.S. Pat. No. 605,845 (Swiss patent application No. 11.788/74, now Swiss Pat. No. 581.904), or between two regions of a monocrystalline silicon wafer comprising a large amount of doping material and forming a lateral Zener diode. Such an element takes very little space and does practically not require any increase in surface.

Figure 5C:
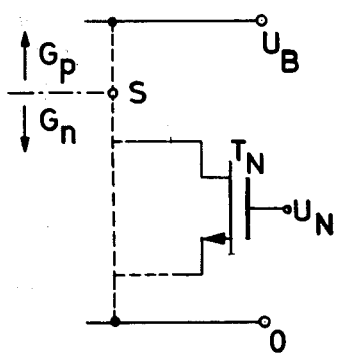

In FIG. 5c the dissipating element coupled to the n transistor group $G_n$ is a transistor $T_N$ biased by a voltage $U_N$ according to one of the following variants:

the transistor $T_N$ has a small gain and $U_N = U_B$ the transistor $T_N$ is weakly biased $0 < U_N < U_B$. The voltage $U_N$ is obtained from a voltage divider or from a suitable biasing circuit so that $T_N$ operates as a current source as described in the U.S. patent application Ser. No. 615,709 (Swiss patent application No. 12.789/74, now Swiss Pat. No. 580.358).

the transistor $T_N$ has a small gain and its gate is connected to the output node of another gate of the circuit such that $U_N = U_B$ or $U_N = 0$ according to the desired operation of the circuit. In this case the transistor must have a small gain in order to avoid a substantial change of the voltage of the corresponding output node by the conduction of the transistor the transistor $T_N$ is of the depletion type and $U_N = 0$, its gate being connected to its source.

Figure 5D:
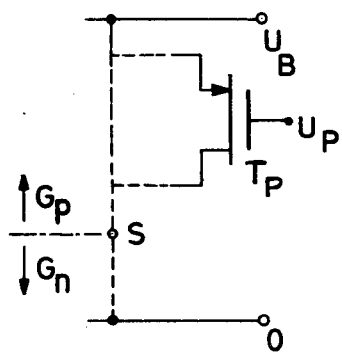

FIG. 5d shows a transistor $T_P$ biased by a voltage $U_P$ for use in the case the dissipating element is coupled with the p channel transistors.

In this case the different biasing variants are in principle analogous to those of FIG. 5c, the biasing voltage being $U_P$. Thus respectively $U_P = 0$ $0 < U_P < U_B$ $U_P = U_B$ or $U_P = 0$ through an appropriate variable $U_P = U_B$ (depletion type transistor)

As to the value of the resistance R of the dissipating element, different conditions are to be fulfilled to assure the correct operation of the logic circuit. On the one hand it is necessary that the resistance R be sufficiently small to keep the voltage drop in the dissipating element due to the maximum leakage current $I_{f\,max}$ passing through this element, smaller than the threshold voltage $V_{T\,min}$ of the one or more transistors having their gate connected to the dissipating element, i.e. that $$R I_{f\,max} < V_{T\,min} \text{ or } R < \frac{V_{T\,min}}{I_{f\,max}}$$

On the other hand the resistance R must be sufficiently high to make the voltage drop $\Delta U$ due to the current through the dissipating element coupled to one of the groups of transistors, across the other group of transistors when the latter is in the conductive state, very small with respect to the supply voltage $U_B$. Considering the simplest case in which each group is formed by a single transistor we have $$\Delta U = \frac{U_B}{G_{MOS} R + 1}, \text{ wherein } G_{MOS} \text{ is the conductance of}$$

the MOS transistor in the conductive state. The condition $\Delta U < U_B$ therefore means:

$$R >> \frac{1}{G_{MOS}}$$

If the conductance of the MOS transistor is expressed as a function of the amplification factor $\beta$ $$G_{MOS} = \beta (U_B - V_T)$$

the condition that for instance $\Delta U < 0,05\, U_B$ becomes approximately $$R > \frac{20}{\beta(U_B - V_T)}.$$

The two above-mentioned static conditions mean that the resistance R of the dissipating element must have a value comprised between the values of the resistance of a MOS transistor respectively in the cut-off and in the conductive state thereof.

Another static condition can be called for by the maximum current consumption $I_{stat}$ which is admissible for the circuit. For instance if the circuit comprises a total number N of dissipating elements and if it can be supposed that 50% of these elements having each a resistance R are conducting at every moment, this condition becomes $$R > \frac{N}{2} \cdot \frac{U_B}{I_{stat}}.$$

Moreover a dynamic condition is to be fulfilled when the circuit is of semi-dynamic nature the potential of a floating node having to be maintained during relatively short time by the capacitance associated to this node, and when the structure and the operation of the circuit are such that this capacitance discharges through the dissipating element. In this case the resistance R of the dissipating element must be sufficiently high to avoid a drift of the node potential during the duration $\tau$ of the floating state of the node. If C is the capacitance associated to such a node, this condition amounts to requiring that the voltage drop across the resistor R at the end of the duration $\tau$, i.e. $\Delta U_R = \tau/RC \cdot U_B$, be substantially less than $U_B$: $\Delta U_R < U_B$. For instance, supposing that $\Delta U_R < 0.1 \, U_B$, the resistance R must be $R > 10 \cdot \tau/C$.

Figure 6A:
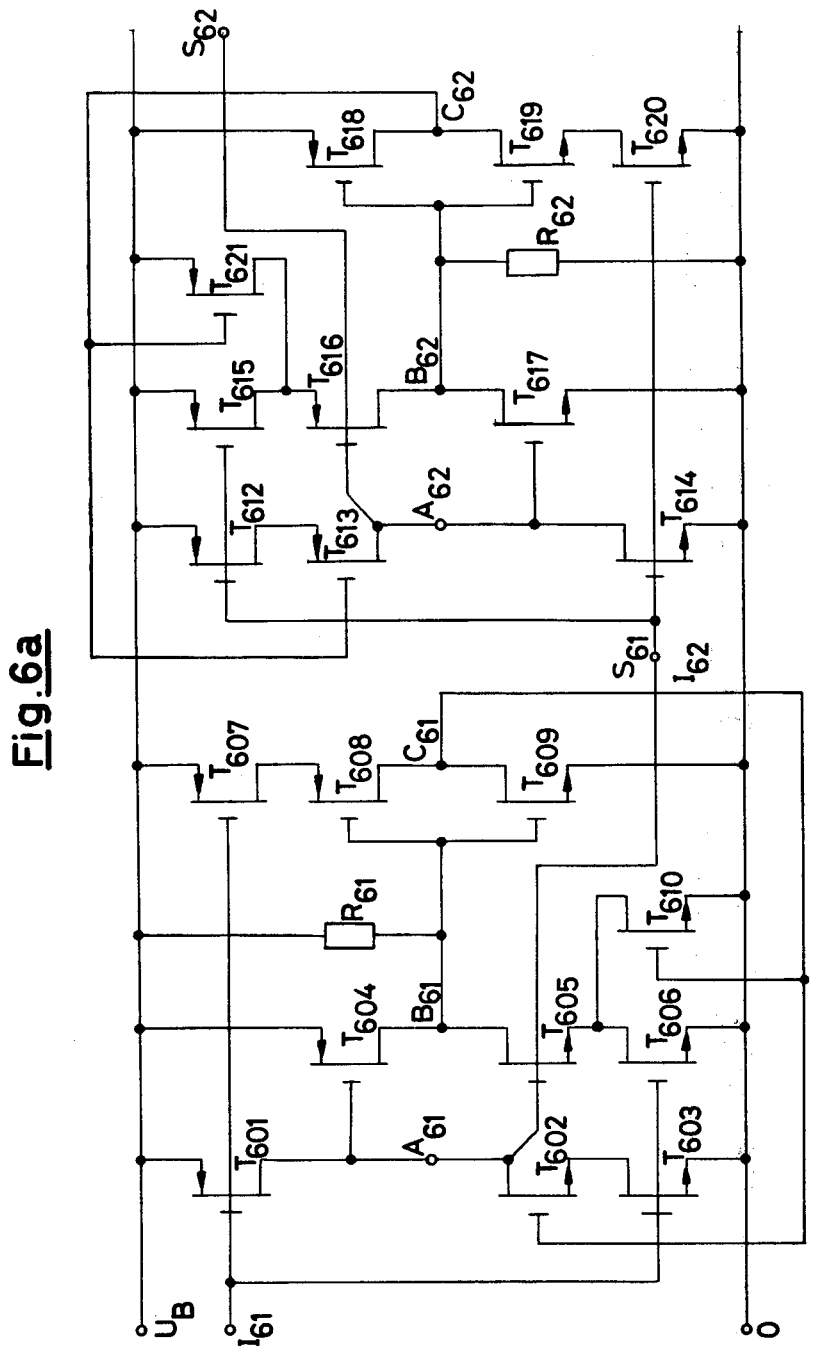
Figure 6B:
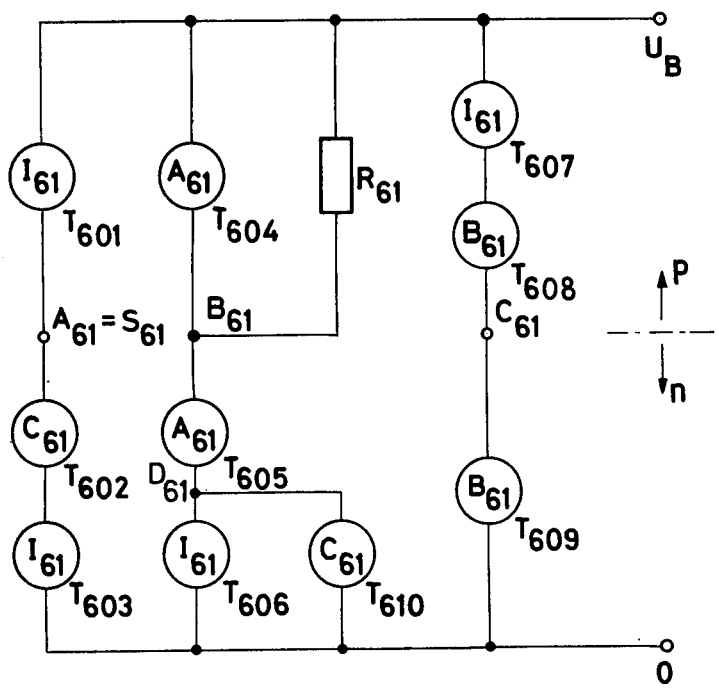

FIG. 6a shows an embodiment of the present logic circuit which constitutes a frequency divider dividing by four. This circuit is a cascade circuit of two binary stages represented in detail in FIG. 6a. For easy comparison, FIG. 6b shows the first stage of this circuit in the symbolism used above in connection with FIGS. 1 and 3.

As shown in the diagram of FIG. 6a the two divider stages comprises each ten transistors designated respectively by $T_{601}$ to $T_{610}$ and $T_{612}$ to $T_{621}$. The first stage comprises three logic gates the respective output nodes of which are designated by $A_{61}$, $B_{61}$, $C_{61}$ and the second stage comprises three logic gates forming output nodes $A_{62}$, $B_{62}$ and $C_{62}$. The transistors connected between these nodes and the positive terminal ($U_B$) of the power supply are p channel MOS transistors and the transistors connected between these nodes and the negative terminal (0) of the power supply are n channel MOS transistors. The circuit further comprises two dissipating elements $R_{61}$ and $R_{62}$ connected respectively between $B_{61}$ and $U_B$ and between $B_{62}$ and 0.

The input signals are applied to an input terminal $I_{61}$ of the first stage and the output terminal $S_{61}$ (= $A_{61}$) of this first stage is connected to the input terminal $I_{62}$ of the following stage. The output signals of the circuit are delivered at the output terminal $S_{62}$ (= $A_{62}$) of the second stage.

Figure 7:
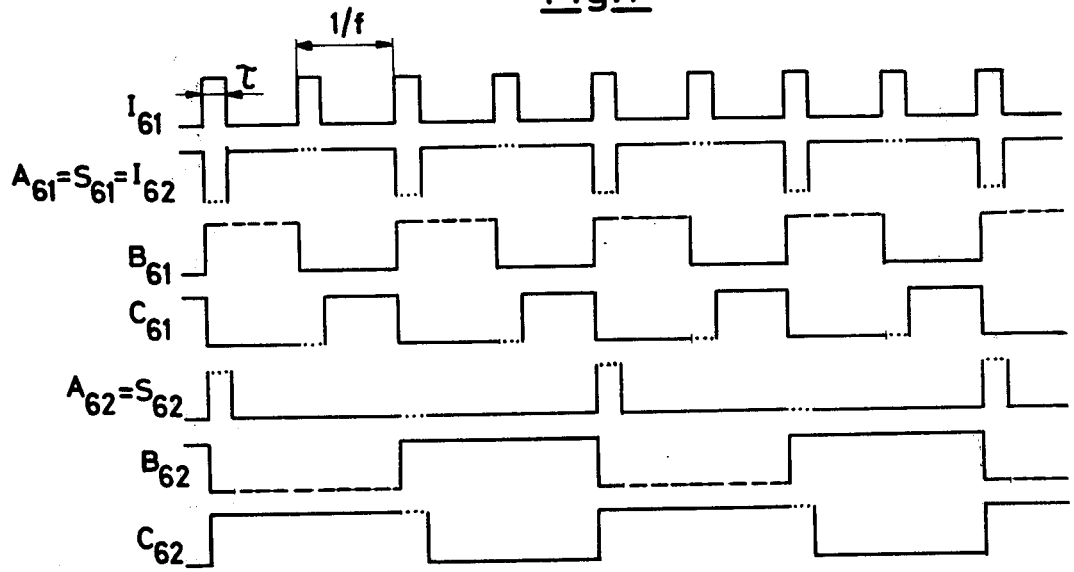

FIG. 7 is a time-chart of the logic signals appearing at different points of the circuit. Each signal is represented in the chart by a voltage which can take two levels corresponding substantially to the potentials $U_B$ and 0. As usual in the art, the voltage conditions of the various points of the circuit will be represented in the following by a logic variable taking the value 1 when the potential of the point is equal to $U_B$ and taking the value 0 when that potential equal that of the ground (0). The input signal $I_{61}$ comprises positive pulses having a relatively short duration $\tau$ (for instance from 1 to 1000 $\mu$sec.) and a repetition frequency f.

To explain the operation of the first stage of the circuit, it is supposed that $I_{61} = 0$, $A_{61} = 1$, $B_{61} = 0$, $C_{61} = 1$ is the original state of the corresponding logic variables. When $I_{61}$ becomes 1 the transistors $T_{602}$ and $T_{603}$ are conducting and bring $A_{61}$ to the 0 state. This transition makes $T_{604}$ conducting and cuts off $T_{605}$ so that $B_{61}$ becomes 1. This latter transition makes $T_{609}$ conducting so that $C_{61}$ passes from 1 to 0. The transistor $T_{602}$ is thus cut off and as $T_{601}$ is also cut off the node $A_{61}$ is floating. However, the parasitic capacitance associated with this node maintains the voltage condition thereof near 0 provided that the leakage current of $T_{601}$ is weak and that the duration of this state is short as mentioned above. The fact that the state of a node is maintained in this way by a capacitance has been indicated in the different time-charts of logic signals such as in FIG. 7 by a dotted part in the signal wave.

When $I_{61}$ comes back to 0 the transistor $T_{601}$ becomes conducting and $A_{61}$ becomes 1. The transistors $T_{604}$ and $T_{606}$ are then simultaneously cut off and the node $B_{61}$ would be floating in the absence of the dissipating element $R_{61}$. This element maintains $B_{61}$ at the one level independently of the duration of the interval $1/f - \tau$. This maintaining of a state through a dissipating element is represented in the waveforms of the logic signals by a dashed line part.

When $I_{61}$ goes for the second time from 0 to 1 the instantaneous conditions are different from those of the beginning of the cycle. Now $B_{61} = 1$, $C_{61} = 0$ and $A_{61}$ keeps the level 1 in a floating state as $T_{602}$ is cut off. The transistors $T_{605}$ and $T_{606}$ are conducting so that $B_{61}$ becomes 0. $T_{607}$ and $T_{609}$ being simultaneously cut off, $C_{61}$ does not change, but the nodes $A_{61}$ and $C_{61}$ are floating during the state of $I_{61} = 1$, i.e. for the short duration $\tau$.

When $I_{61}$ now again becomes 0, $T_{607}$ and $T_{608}$ are conducting and $C_{61}$ becomes 1. On the other hand $T_{606}$ is cut off so that the potential of $B_{61}$ tends to drift away due to the current through the dissipating element $R_{61}$. To keep $B_{61}$ at 0, a transistor $T_{610}$ is connected between the common point $D_{61}$ of the transistors $T_{605}$ and $T_{606}$ and ground, this transistor $T_{610}$ being controlled by $C_{61}$. This variable being equal to 1, $T_{610}$ is conducting and maintains $B_{61}$ at 0. At this time the circuit is again in the original condition and the cycle starts again at the next transition of $I_{61}$ to 1.

As the output $S_{61}$ is connected to the node $A_{61}$ it delivers a logic variable the zero state thereof has a duration $\tau$ and a repetition frequency of f/2.

The second stage of the circuit has a similar structure to the first one, the groups of transistors in each logic gate and the conduction type thereof being merely reversed due to the reversed polarity of the input pulses. The operation of that stage can therefore be described in the same way as that of the first stage. The output signal of the second stage $S_{62}$ therefore comprises positive pulses with a duration $\tau$ identical to that of the input pulses $I_{61}$, the repetition frequency at $S_{62}$ being one fourth of the input frequency of the circuit.

A plurality of stages or pairs of stages of the abovedescribed divider can be coupled in series for obtaining a division by a desired multiple of two. An even number of stages then delivers pulses of the same polarity as the input pulses.

Conveniently the operation of a frequency divider circuit as described can be explained by means of a transition table. Such a table represents all the states through which the circuit can go, i.e. the different combinations of values of the internal variables of the circuit which can occur, as well as the input or control variables of the circuit. There is no difference to be made between internal variables and output variables as each internal variable can be used as an output variable.

The values which can be taken simultaneously by the different variables are indicated on a same line of the transition table and the successive states of the circuit follow upon each other in the downward direction. As a general rule the states of the circuit comprise stable and transient states. Stable states have the same duration as the time interval in which no change of the input variables occurs. Transient states are intermediate states of short duration between the instant of a variation of an input variable and the following stable state of the circuit. A number of transient states can follow upon each other between two stable states.

In these transition tables there are further represented the conditions of the various transistors of the circuit, the conductive condition of a transistor being symbolized by 1 and its blocking condition by 0. For easier reference the states of the control variable corresponding to the conductive condition of the transistors have been indicated in the tables below the index characterizing each transistor.

Table I hereunder illustrates the operation of the first stage of the divider of FIG. 6a (corresponding also to FIG. 6b) as already described earlier. It is to be noted that the last line of this table is identical to the first line due to the cyclic nature of the sequence of states.

Table II represents in the same way the operation of the second stage of the divider. It can be seen therefrom, that the states of the second stage are obtained from the corresponding states of the first stage by inversion of the levels of the corresponding variables.

The stages of the divider circuit described above can be considered as being derived from a dynamic circuit Table I

| STATES | | | | CONDUCTION STATES OF THE TRANSISTORS | | | | | | | | | |
|---|---|---|---|---|---|---|---|---|---|---|---|---|---|
| | | | | 601 | 602 | 603 | 604 | 605 | 606 | 607 | 608 | 609 | 610 |
| $I_{61}$ | $A_{61}$ | $B_{61}$ | $C_{61}$ | $\overline{I}_{61}$ | $C_{61}$ | $I_{61}$ | $\overline{A}_{61}$ | $A_{61}$ | $I_{61}$ | $I_{61}$ | $B_{61}$ | $B_{61}$ | $C_{61}$ |
| 0 | 1 | 0 | 1 | 1 | 1 | 0 | 0 | 1 | 0 | 1 | 1 | 0 | 1 |
| 1 | (1) | 0 | 1 | 0 | 1 | 1 | 0 | 1 | 1 | 0 | 1 | 0 | 1 |
| 1 | 0 | (0) | 1 | 0 | 1 | 1 | 1 | 0 | 1 | 0 | 1 | 0 | 1 |
| 1 | 0 | 1 | (1) | 0 | 1 | 1 | 1 | 0 | 1 | 0 | 0 | 1 | 1 |
| 1 | 0 | 1 | 0 | 0 | 0 | 1 | 1 | 0 | 1 | 0 | 0 | 1 | 0 |
| 0 | (0) | 1 | 0 | 1 | 0 | 0 | 1 | 0 | 0 | 1 | 0 | 1 | 0 |
| 0 | 1 | 1 | 0 | 1 | 0 | 0 | 0 | 1 | 0 | 1 | 0 | 1 | 0 |
| 1 | 1 | (1) | 0 | 0 | 0 | 1 | 0 | 1 | 1 | 0 | 0 | 1 | 0 |
| 1 | 1 | 0 | 0 | 0 | 0 | 1 | 0 | 1 | 1 | 0 | 1 | 0 | 0 |
| 0 | 1 | 0 | (0) | 1 | 0 | 0 | 0 | 1 | 0 | 1 | 1 | 0 | 0 |
| 0 | 1 | 0 | 1 | 1 | 1 | 0 | 0 | 1 | 0 | 1 | 1 | 0 | 1 |

Table II

| STATES | | | | CONDUCTION STATES OF THE TRANSISTORS | | | | | | | | | |
|---|---|---|---|---|---|---|---|---|---|---|---|---|---|
| | | | | 612 | 613 | 614 | 615 | $\overline{616}$ | 617 | $\overline{618}$ | 619 | 620 | $\overline{621}$ |
| $I_{62}$ | $A_{62}$ | $B_{62}$ | $C_{62}$ | $\overline{I}_{62}$ | $C_{62}$ | $I_{62}$ | $\overline{I}_{62}$ | $A_{62}$ | $A_{62}$ | $B_{62}$ | $B_{62}$ | $I_{62}$ | $C_{62}$ |
| 1 | 0 | 1 | 0 | 0 | 1 | 1 | 0 | 1 | 0 | 0 | 1 | 1 | 1 |
| 0 | (0) | 1 | 0 | 1 | 1 | 0 | 1 | 1 | 0 | 0 | 1 | 0 | 1 |
| 0 | 1 | (1) | 0 | 1 | 1 | 0 | 1 | 0 | 1 | 0 | 1 | 0 | 1 |
| 0 | 1 | 0 | (0) | 1 | 1 | 0 | 1 | 0 | 1 | 1 | 0 | 0 | 1 |
| 0 | 1 | 0 | 1 | 1 | 0 | 0 | 1 | 0 | 1 | 1 | 0 | 0 | 0 |
| 1 | (1) | 0 | 1 | 0 | 0 | 1 | 0 | 0 | 1 | 1 | 0 | 1 | 0 |
| 1 | 0 | 0 | 1 | 0 | 0 | 1 | 0 | 1 | 0 | 1 | 0 | 1 | 0 |
| 0 | 0 | (0) | 1 | 1 | 0 | 0 | 1 | 1 | 0 | 1 | 0 | 0 | 0 |
| 0 | 0 | 1 | 1 | 1 | 0 | 0 | 1 | 1 | 0 | 0 | 1 | 0 | 0 |
| 1 | 0 | 1 | (1) | 0 | 0 | 1 | 0 | 1 | 0 | 0 | 1 | 1 | 0 |
| 1 | 0 | 1 | 0 | 0 | 1 | 1 | 0 | 1 | 0 | 0 | 1 | 1 | 1 |

In the following tables the kind of the states of the circuit or of a given variable has been indicated in the following manner:

| | |
|---|---|
| 0101 | static stable state of the circuit, i.e. stable state of unlimited duration |
| 1010 | dynamic stable state of the circuit i.e. stable state of relatively short duration |
| not underlined | transient state |
| 1 | state of a variable maintained by a dissipating element |
| 1 | state of a variable maintained only by the charge of the capacitance associated with the node (floating state of the node) |
| (1) | state which is not compatible with the conduction state of the transistors according to the diagram: such a variable must undergo transition until the following state. | such as described in the article "CODYMOS frequency dividers..." mentioned above. The essential difference with respect to this dynamic circuit is the presence of the dissipating elements $R_{61}$ and $R_{62}$ and of the transistors $T_{610}$ and $T_{621}$. Due to these additional elements the present circuit shows a semi-dynamic behaviour, which means that it allows the processing of input pulses having as low a repetition frequency as desired provided that the duration of these pulses is sufficiently short. On the other hand, the additional transistors are auxiliary transistors which do not participate in the commutations but provide correct operation of the circuit in spite of the presence of the power dissipating elements, by maintaining the nodes to which these dissipating elements are coupled in a desired state under the influence of an appropriate control variable.

From the same above-mentioned dynamic circuit a variant of a divider circuit can be obtained which has two divider by-two stages having also a semi-dynamic behaviour. This circuit which is shown in FIG. 8, is designed for receiving input signals $I_{81}$ having a 1 level during time intervals of unlimited duration between short pulses of 0 level.

Figure 8:
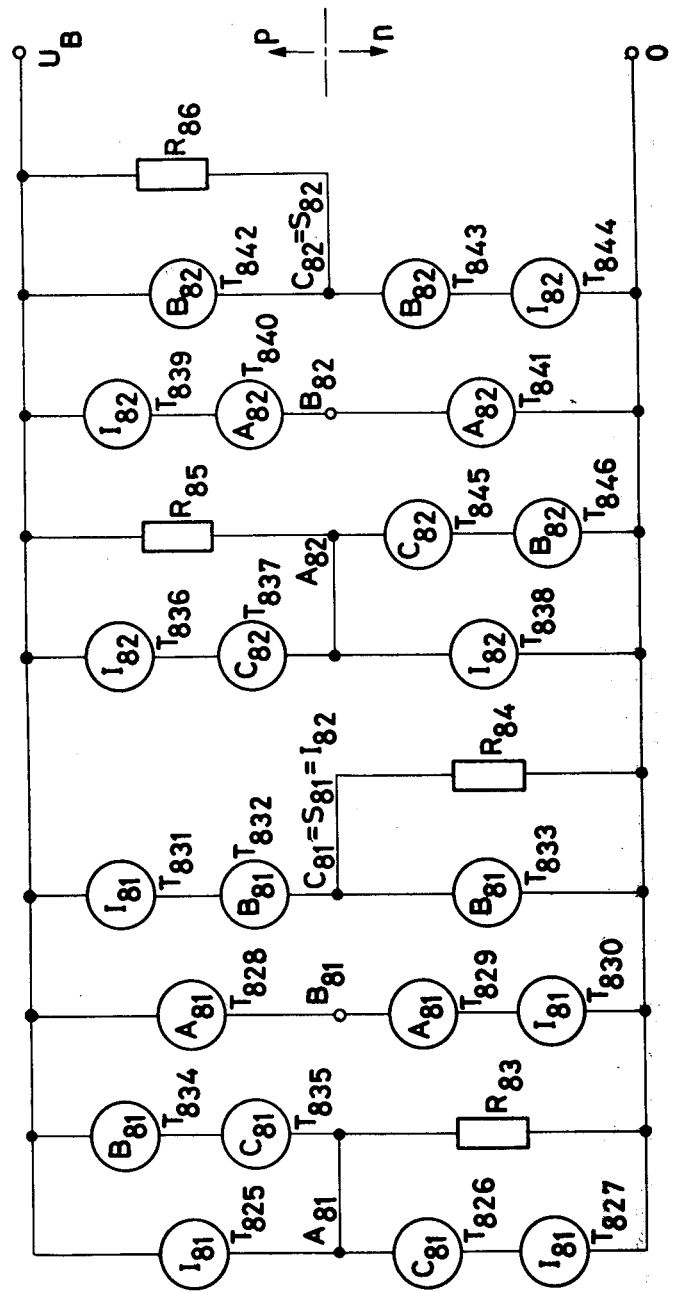
FIG. 8 is the diagram of a variant of a frequency divider comprising two stages dividing by two.

The first stage of the circuit of FIG. 8 delivers output signals $S_{81}$ in the form of short positive pulses which thus are inverted with respect to the input pulses and which constitute the input signals $I_{82}$ of the second stage. This latter delivers again short pulses of 0 value spaced by intervals at the level 1, the frequency of these pulses being equal to a fourth of the frequency of the input pulses $I_{81}$.

Each of the two stages of the divider circuit of FIG. 8 comprises three logic gates, the output nodes of which are respectively $A_{81}$, $B_{81}$, $C_{81}$ and $A_{82}$, $B_{82}$, $C_{82}$. The MOS transistors connected between these nodes and the positive terminal ($U_B$) of the supply voltage are of the p channel type and the others of the n channel type. The nodes $A_{81}$ and $C_{81}$ on the one hand and $A_{82}$ and $C_{82}$ on the other hand are respectively connected to the ground and to $U_B$ through dissipating elements $R_{83}$ to $R_{86}$. Moreover two auxiliary transistors $T_{834}$ and $T_{835}$ are connected in series between the node $A_{81}$ and the terminal $U_B$ and similarly the auxiliary transistors $T_{845}$ and $T_{846}$ are connected to the node $A_{82}$ and ground.

The operation of the circuit of FIG. 8 results from the transition table III which corresponds to the first stage of the divider circuit, but which applies, with the necessary inversions, in the same manner as explained above to the second stage of the circuit. As the circuit of FIG. 8 can be considered as derived from the same dynamic circuit as the one shown in FIG. 6a, the transition table III shows the same stable and transient states as table I. The original state of table III is a stable state of long duration as in the preceding example and therefore the states are shifted with respect to that of table I (line 1 of table III corresponds to line 5 of table I). However the operation is different with respect to the states of short and long duration and the states maintained respectively by the dissipating elements and the auxiliary transistors. The kind of these states is indicated in the table by the above-mentioned symbols.

Table III

| STATES | | | | CONDUCTION STATES OF THE TRANSISTORS | | | | | | | | | | |
|---|---|---|---|---|---|---|---|---|---|---|---|---|---|---|
| | | | | 825 | 826 | 827 | 828 | 829 | 830 | 831 | 832 | 833 | 834 | 835 |
| $I_{81}$ | $A_{81}$ | $B_{81}$ | $C_{81}$ | $\bar{I}_{81}$ | $C_{81}$ | $I_{81}$ | $A_{81}$ | $A_{81}$ | $I_{81}$ | $\bar{I}_{81}$ | $B_{81}$ | $B_{81}$ | $B_{81}$ | $C_{81}$ |
| 1 | 0 | 1 | 0 | 0 | 0 | 1 | 1 | 0 | 1 | 0 | 0 | 1 | 0 | 1 |
| 0 | (0) | 1 | 0 | 1 | 0 | 0 | 1 | 0 | 0 | 1 | 0 | 1 | 0 | 1 |
| 0 | 1 | 1 | 0 | 1 | 0 | 0 | 0 | 1 | 0 | 1 | 0 | 1 | 0 | 1 |
| 1 | 1 | (1) | 0 | 0 | 0 | 1 | 0 | 1 | 1 | 0 | 0 | 1 | 0 | 1 |
| 1 | 1 | 0 | 0 | 0 | 0 | 1 | 0 | 1 | 1 | 0 | 1 | 0 | 1 | 1 |
| 0 | 1 | 0 | (0) | 1 | 0 | 0 | 0 | 1 | 0 | 1 | 1 | 0 | 1 | 1 |
| 0 | 1 | 0 | 1 | 1 | 1 | 0 | 0 | 1 | 0 | 1 | 1 | 0 | 1 | 0 |
| 1 | (1) | 0 | 1 | 0 | 1 | 1 | 0 | 1 | 1 | 0 | 1 | 0 | 1 | 0 |
| 1 | 0 | (0) | 1 | 0 | 1 | 1 | 1 | 0 | 1 | 0 | 1 | 0 | 1 | 0 |
| 1 | 0 | 1 | (1) | 0 | 1 | 1 | 1 | 0 | 1 | 0 | 0 | 1 | 0 | 0 |
| 1 | 0 | 1 | 0 | 0 | 0 | 1 | 1 | 0 | 1 | 0 | 0 | 1 | 0 | 1 |

Table IV

| STATES | | | | CONDUCTION STATES OF THE TRANSISTORS | | | | | | | | | | |
|---|---|---|---|---|---|---|---|---|---|---|---|---|---|---|
| | | | | 901 | 902 | 903 | 904 | 905 | 906 | 907 | 908 | 909 | 910 | 934 | 935 |
| $I_9$ | $A_9$ | $B_9$ | $C_9$ | $\bar{I}_9$ | $C_9$ | $I_9$ | $A_9$ | $\bar{9}$ | $I_9$ | $\bar{I}_9$ | $B_9$ | $B_9$ | $C_9$ | $B_9$ | $C_9$ |
| 0 | 1 | 0 | 1 | 1 | 1 | 0 | 0 | 1 | 0 | 1 | 1 | 0 | 1 | 1 | 0 |
| 1 | (1) | 0 | 1 | 0 | 1 | 1 | 0 | 1 | 1 | 0 | 1 | 0 | 1 | 1 | 0 |
| 1 | 0 | (0) | 1 | 0 | 1 | 1 | 1 | 0 | 1 | 0 | 1 | 0 | 1 | 1 | 0 |
| 1 | 0 | 1 | (1) | 0 | 1 | 1 | 1 | 0 | 0 | 0 | 1 | 1 | 0 | 0 | 0 |
| 1 | 0 | 1 | 0 | 0 | 0 | 1 | 1 | 0 | 1 | 0 | 0 | 1 | 0 | 0 | 1 |
| 0 | (0) | 1 | 0 | 1 | 0 | 0 | 1 | 0 | 1 | 0 | 1 | 0 | 0 | 0 | 1 |
| 0 | 1 | 1 | 0 | 1 | 0 | 0 | 0 | 1 | 0 | 1 | 0 | 1 | 0 | 0 | 1 |
| 1 | 1 | (1) | 0 | 0 | 0 | 1 | 0 | 1 | 1 | 0 | 0 | 1 | 0 | 0 | 1 |
| 1 | 1 | 0 | 0 | 0 | 1 | 0 | 1 | 1 | 0 | 1 | 0 | 0 | 1 | 1 |
| 0 | 1 | 0 | (0) | 1 | 0 | 0 | 0 | 1 | 0 | 1 | 1 | 0 | 0 | 1 | 1 |
| 0 | 1 | 0 | 1 | 1 | 1 | 0 | 0 | 1 | 0 | 1 | 1 | 0 | 1 | 1 | 0 |

Figure 9:
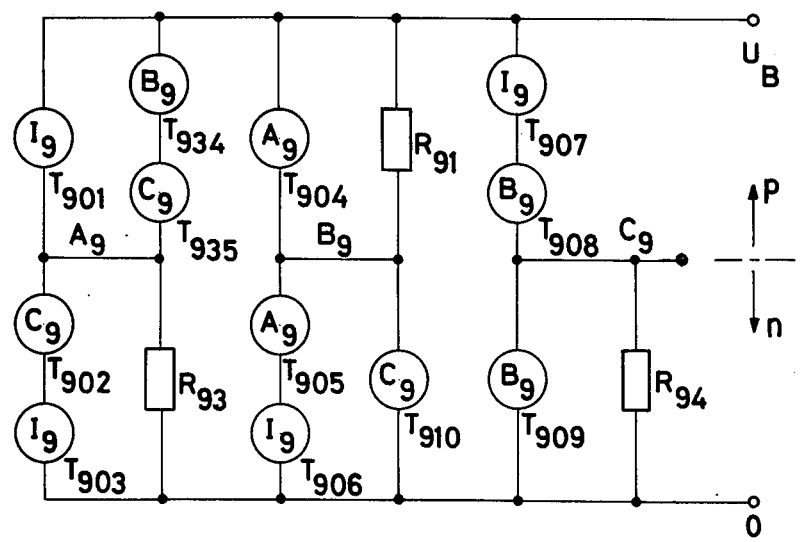
FIG. 9 is a diagram of another variant of a divider by-two circuit.

FIG. 9 represents another variant of a divider by-two circuit. This circuit has the same basic structure as the first stage of FIG. 8 but comprises an additional dissipating element $R_{91}$ and an additional auxiliary transistor $T_{910}$. This dissipating element is connected between the node $B_9$ of the circuit and the terminal $U_B$, while the additional MOS transistor $T_{910}$ of the n channel type is connected between node $B_9$ and ground and is controlled by the variable $C_9$. The addition of these components gives the circuit of FIG. 9 a purely static behaviour, which means that it is independent of the duration of the states of the input variable $I_9$. By choosing the variable $B_9$ as the output variable of the circuit, any desired number of stages identical to the circuit of FIG. 9 can be coupled in series to obtain a divider by a corresponding multiple of two.

Table IV represents the successive states of the circuit and the conduction conditions of the transistors of the diagram of FIG. 9.

Figure 10:
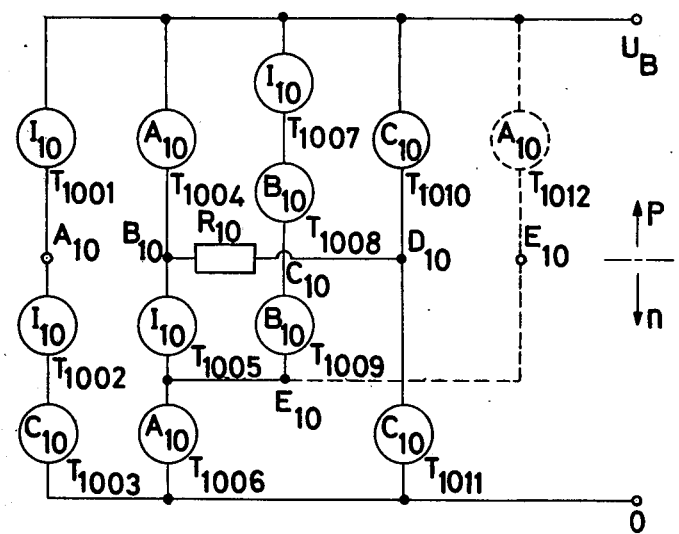
FIG. 10 is the diagram of still another example of a divider by-two circuit.

FIG. 10 shows another example of a divider by-two circuit using a dissipating element and having a semi-dynamic behaviour. This circuit comprises three basic logic gates having nodes $A_{10}$, $B_{10}$ and $C_{10}$ according to the diagram of FIG. 10. In the circuit the gates having the respective nodes $B_{10}$ and $C_{10}$ comprise a common transistor $T_{1006}$. A dissipating element $R_{10}$ is connected between node $B_{10}$ and node $D_{10}$, the latter being coupled on the one hand through a p channel transistor $T_{1010}$ to the positive terminal $U_B$ and on the other hand through a n channel transistor $T_{1011}$ to the ground (0). Transistors $T_{1010}$ and $T_{1011}$ are controlled by the variable $C_{10}$ and constitute thus an inverter, switching $R_{10}$ alternatively from one pole of the power supply to the other.

Figure 11:
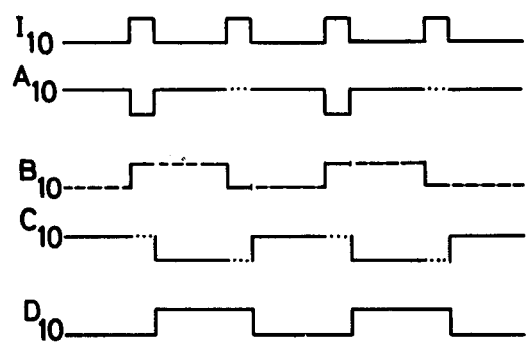
FIG. 11 is a time-chart of the logic signals appearing in the circuit of FIG. 10.

The input signal $I_{10}$ is formed by positive pulses of short duration (1 to 1000 $\mu$sec.) spaced from each other by intervals of unlimited duration. FIG. 11 shows the input signal wave form as well as the logic signals appearing at the nodes of the circuit of the FIG. 10.

During the intervals in which $I_{10}$ is equal to 0, the node $B_{10}$ would be floating in the absence of the dissipating element $R_{10}$. The connection of this dissipating element to node $D_{10}$ avoids a drift of the potential of $B_{10}$ by the leakage currents flowing during the long duration intervals between the input pulses. The shown configuration avoids however that the dissipating element draws additional current during the same intervals, which is an important advantage.

When choosing for the transistors $T_{1010}$ and $T_{1011}$ transistors having low gain, element $R_{10}$ can be replaced by a mere connection. In this case, the said two transistors operate as dissipating elements during the short pulses of the input signal.

Transition table V illustrates again the operation of the circuit.

A plurality of divider stages of the type shown in FIG. 10 can be coupled in series provided that stages exactly like those of the FIG. 10 circuit made to alternate with stages obtained by exchanging the n channel transistors and the p channel transistors as well as the power supply terminals. The output signals are always taken from the points corresponding to point $A_{10}$.

adapted to divide the repetition frequency of a series of short duration pulses which here are positive pulses spaced from each other by intervals of unlimited duration. The circuit of FIG. 12 comprises three logic gates, each built up of a group of two series-connected p channel MOS transistors and of a group of three n channel MOS transistors two of which last transistors being coupled in parallel and connected on one side to ground, the third transistor being connected in series with the two first ones. Furthermore the p channel group comprises a dissipating element ($R_{121}$, $R_{122}$, $R_{123}$) connected on one side to the positive terminal $U_B$ of the power supply and connected in parallel with the transistor which is controlled by an internal variable. The nodes of the three logic gates are respectively designated by $A_{12}$, $B_{12}$ and $C_{12}$.

Figure 13:
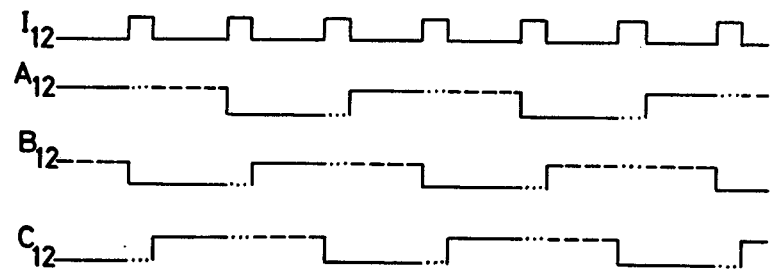
FIG. 13 is a diagram of the logic signals appearing in the circuit of FIG. 12.

FIG. 13 is a time-chart of the logic signals appearing in this circuit, $I_{12}$ being the input signal and $A_{12}$, $B_{12}$, $C_{12}$ being the internal variables. The transition table VI further illustrates the operation of the circuit.

It is to be noted that during each of the stable states of long duration the variable which could go from 1 to 0 due to leakage currents is maintained by the corresponding dissipating element; on the other hand, the auxiliary transistors $T_{1206}$, $T_{1212}$ and $T_{1218}$ which do not participate in the commutations, allow to maintain at the 0 level the variable which would show a tendency to go from 0 to 1 during the stable states of long dura- Table V

| STATES | | | | | | CONDUCTION STATES OF THE TRANSISTORS | | | | | | | | | | | |
|---|---|---|---|---|---|---|---|---|---|---|---|---|---|---|---|---|---|
| | | | | | | 1001 | 1002 | 1003 | 1004 | 1005 | 1006 | 1007 | 1008 | 1009 | 1010 | 1011 | (1012) |
| $I_{10}$ | $A_{10}$ | $B_{10}$ | $C_{10}$ | $D_{10}$ | $(E_{10})$ | $\bar{I}_{10}$ | $I_{10}$ | $C_{10}$ | $A_{10}$ | $I_{19}$ | $A_{10}$ | $B_{10}$ | $B_{10}$ | $B_{10}$ | $C_{10}$ | $C_{10}$ | $A_{10}$ |
| 0 | 1 | 0 | 1 | 0 | 0 | 1 | 0 | 1 | 0 | 0 | 1 | 1 | 1 | 0 | 0 | 1 | 0 |
| 1 | (1) | 0 | 1 | 0 | 0 | 0 | 1 | 1 | 0 | 1 | 1 | 0 | 1 | 0 | 0 | 1 | 0 |
| 1 | 0 | (0) | 1 | 0 | (0) | 0 | 1 | 1 | 1 | 1 | 0 | 0 | 1 | 0 | 0 | 1 | 1 |
| 1 | 0 | 1 | 1 | 0 | 1 | 0 | 1 | 1 | 1 | 1 | 0 | 0 | 0 | 1 | 0 | 1 | 1 |
| 0 | (0) | 1 | 1 | 0 | 1 | 1 | 0 | 1 | 1 | 0 | 0 | 1 | 0 | 1 | 0 | 1 | 1 |
| 0 | 1 | 1 | (1) | 0 | (1) | 1 | 0 | 1 | 0 | 0 | 1 | 1 | 0 | 1 | 0 | 1 | 0 |
| 0 | 1 | 1 | 0 | (0) | 0 | 1 | 0 | 0 | 0 | 0 | 1 | 1 | 0 | 1 | 1 | 0 | 0 |
| 0 | 1 | 1 | 0 | 1 | 0 | 1 | 0 | 0 | 0 | 0 | 1 | 1 | 0 | 1 | 1 | 0 | 0 |
| 1 | 1 | (1) | 0 | 1 | 0 | 0 | 1 | 0 | 0 | 1 | 1 | 0 | 0 | 1 | 1 | 0 | 0 |
| 1 | 1 | 0 | 0 | 1 | 0 | 0 | 1 | 0 | 0 | 1 | 1 | 0 | 1 | 0 | 1 | 0 | 0 |
| 0 | 1 | 0 | (0) | 1 | 0 | 1 | 0 | 0 | 0 | 0 | 1 | 1 | 1 | 0 | 1 | 0 | 0 |
| 0 | 1 | 0 | 1 | (1) | 0 | 1 | 0 | 1 | 0 | 0 | 1 | 1 | 1 | 0 | 0 | 1 | 0 |
| 0 | 1 | 0 | 1 | 0 | 0 | 1 | 0 | 1 | 0 | 0 | 1 | 1 | 1 | 0 | 0 | 1 | 0 |

A variant of the preceding circuit is shown in dashed lines in the diagram of FIG. 10. This variant is obtained by adding to the basic circuit a p channel transistor $T_{1012}$ controlled by $A_{10}$ so as to form a fourth logic gate, the node $E_{10}$ of which lies between $T_{1012}$ and $T_{1006}$. Thus an output signal is obtained in $E_{10}$ which is inverted with respect to $A_{10}$ and which is therefore formed by positive pulses of same duration as the input pulses but with a repetition frequency equal one half of that of the input pulses. The addition of transistor $T_{1012}$ allows to couple in series identical stages to obtain a divider by a multiple of two. Table V shows under ($E_{10}$) the states of node $E_{10}$ and under (1012) the conduction of transistor $T_{1012}$.

Figure 12:
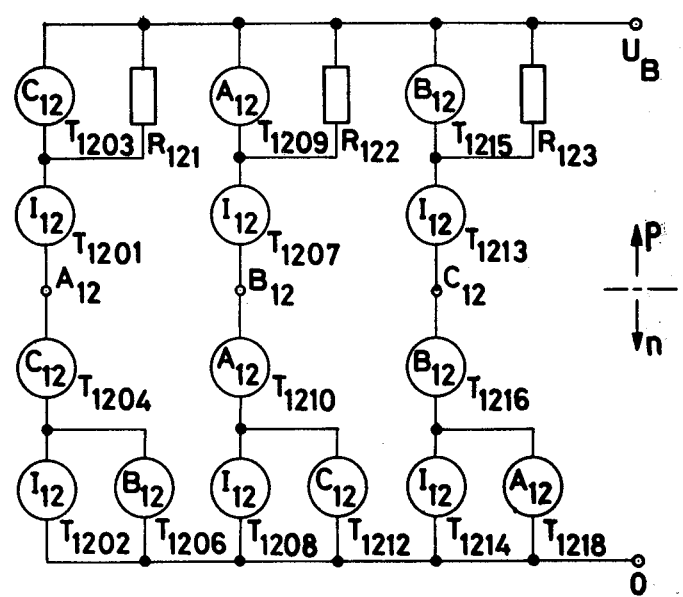
FIG. 12 is a basic diagram of a divider by three.

FIG. 12 is the basic circuit diagram of a divider by three with semi-dynamic behaviour, i.e. a circuit tion.

Figure 14:
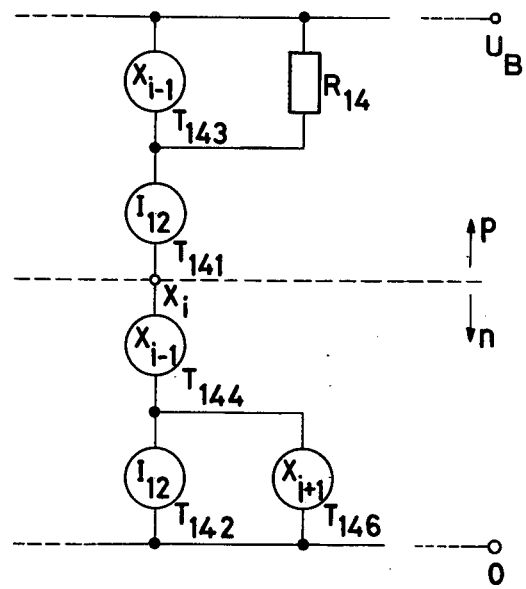
FIG. 14 is a diagram of an intermediate cell for the circuit of FIG. 12 allowing to build up a divider by an uneven number N.

The basic circuit of a divider by three according to FIG. 12 can be extended to the division by any desired uneven number N by introducing for instance between the first two logic gates corresponding to nodes $A_{12}$ and $B_{12}$, an even number (N − 3) of additional logic gates having the general structure shown in FIG. 14.

In FIG. 14, $X_i$ designates the output node of the logic gate or intermediate cell of the rank i (i=2, 3, ..., N − 3, N − 2). Such a cell is built up in a similar manner to the other logic gates of the circuit of FIG. 12, the control variables of the p channel transistors $T_{141}$ and $T_{143}$ being respectively the input signal $I_{12}$ and the logic variable of the output node of the preceding gate $X_{i-1}$, while the control variables of the n channel transistors Table VI

| STATES | | | | CONDUCTION STATES OF THE TRANSISTORS | | | | | | | | | | | | | |
|---|---|---|---|---|---|---|---|---|---|---|---|---|---|---|---|---|---|
| | | | | 1201 | 1203 | 1207 | 1209 | 1213 | 1215 | 1202 | 1204 | 1206 | 1208 | 1210 | 1212 | 1214 | 1216 | 1218 |
| $I_{12}$ | $A_{12}$ | $B_{12}$ | $C_{12}$ | $\bar{I}_{12}$ | $C_{12}$ | $\bar{I}_{12}$ | $A_{12}$ | $\bar{I}_{12}$ | $B_{12}$ | $I_{12}$ | $C_{12}$ | $B_{12}$ | $I_{12}$ | $A_{12}$ | $C_{12}$ | $I_{12}$ | $B_{12}$ | $A_{12}$ |
| 0 | 1 | 1 | 0 | 1 | 1 | 1 | 0 | 1 | 0 | 0 | 0 | 1 | 0 | 1 | 0 | 0 | 1 | 1 |
| 1 | 1 | (1) | 0 | 0 | 1 | 0 | 0 | 0 | 0 | 1 | 0 | 1 | 1 | 1 | 0 | 1 | 1 | 1 |
| 1 | 1 | 0 | 0 | 0 | 1 | 0 | 0 | 0 | 1 | 1 | 0 | 0 | 1 | 1 | 0 | 1 | 0 | 1 |
| 0 | 1 | 0 | (0) | 1 | 1 | 1 | 0 | 1 | 1 | 0 | 0 | 0 | 0 | 1 | 0 | 0 | 0 | 1 |
| 0 | 1 | 0 | 1 | 1 | 0 | 1 | 0 | 1 | 1 | 0 | 1 | 0 | 0 | 1 | 1 | 0 | 0 | 1 |
| 1 | (1) | 0 | 1 | 0 | 0 | 0 | 0 | 0 | 1 | 1 | 1 | 0 | 1 | 1 | 1 | 1 | 0 | 1 |

Table VI-continued

| STATES | | | | CONDUCTION STATES OF THE TRANSISTORS | | | | | | | | | | | | | | |
|---|---|---|---|---|---|---|---|---|---|---|---|---|---|---|---|---|---|---|
| | | | | 1201 | 1203 | 1207 | 1209 | 1213 | 1215 | 1202 | 1204 | 1206 | 1208 | 1210 | 1212 | 1214 | 1216 | 1218 |
| $I_{12}$ | $A_{12}$ | $B_{12}$ | $C_{12}$ | $I_{12}$ | $C_{12}$ | $I_{12}$ | $A_{12}$ | $I_{12}$ | $B_{12}$ | $I_{12}$ | $C_{12}$ | $B_{12}$ | $I_{12}$ | $A_{12}$ | $C_{12}$ | $I_{12}$ | $B_{12}$ | $A_{12}$ |
| 1 | 0 | 0 | 1 | 0 | 0 | 0 | 1 | 0 | 1 | 1 | 1 | 0 | 1 | 0 | 1 | 1 | 0 | 0 |
| 0 | 0 | (0) | 1 | 1 | 0 | 1 | 1 | 1 | 1 | 0 | 1 | 0 | 0 | 0 | 1 | 0 | 0 | 0 |
| 0 | 0 | 1 | 1 | 1 | 0 | 1 | 1 | 1 | 0 | 0 | 1 | 1 | 0 | 0 | 1 | 0 | 1 | 0 |
| 1 | 0 | 1 | (1) | 0 | 0 | 0 | 1 | 0 | 0 | 1 | 1 | 1 | 1 | 0 | 1 | 1 | 1 | 0 |
| 1 | 0 | 1 | 0 | 0 | 1 | 0 | 1 | 0 | 0 | 1 | 0 | 1 | 1 | 0 | 0 | 1 | 1 | 0 |
| 0 | (0) | 1 | 0 | 1 | 1 | 1 | 1 | 1 | 0 | 0 | 0 | 1 | 0 | 0 | 0 | 0 | 1 | 0 |
| 0 | 1 | 1 | 0 | 1 | 1 | 1 | 0 | 1 | 0 | 0 | 0 | 1 | 0 | 1 | 0 | 0 | 1 | 1 |

$T_{142}$, $T_{144}$ and $T_{146}$ are respectively $I_{12}$, $X_{i-1}$ and $X_{i+1}$ (this last variable being the logic variable of the output node of the following gate).

The entire basic circuit of a divider by uneven N thus comprises 5N transistors and N dissipating elements.

Figure 15:
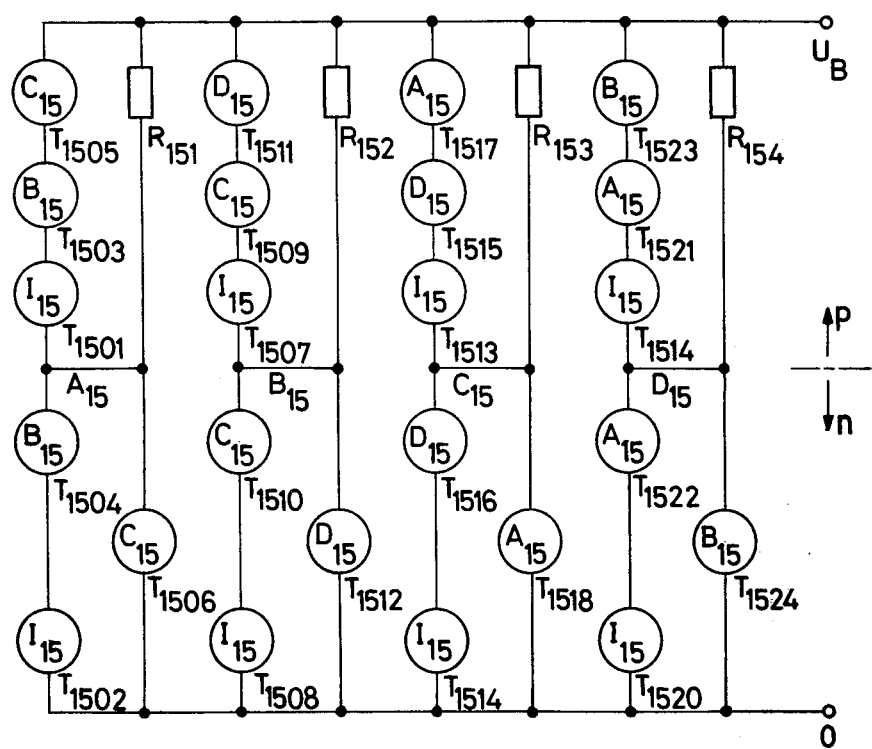
FIG. 15 is the diagram of a basic circuit of divider by four.

FIG. 15 is a diagram of a basic circuit of a divider by four, which circuit can be considered as derived from a dynamic circuit such as described in Swiss patent No. 566.092. The corresponding dynamic circuit comprises in the diagram of FIG. 15 four logic gates built up respectively by the transistors $T_{1501}$ to $T_{1505}$, $T_{1507}$ to $T_{1511}$, $T_{1513}$ to $T_{1517}$ and $T_{1519}$ to $T_{1523}$, and the corresponding four nodes are designated by $A_{15}$, $B_{15}$, $C_{15}$ and $D_{15}$. Due to the presence of four dissipating elements $R_{151}$ to $R_{154}$ which are respectively connected between the nodes $A_{15}$ to $D_{15}$ and the positive terminal $U_B$ and due to the presence of four auxiliary transistors $T_{1506}$, $T_{1512}$, $T_{1518}$ and $T_{1524}$ which are respectively connected between the same nodes and the 0 terminal of the power supply, the circuit of FIG. 15 shows a semi-dynamic behaviour.

Figure 16:
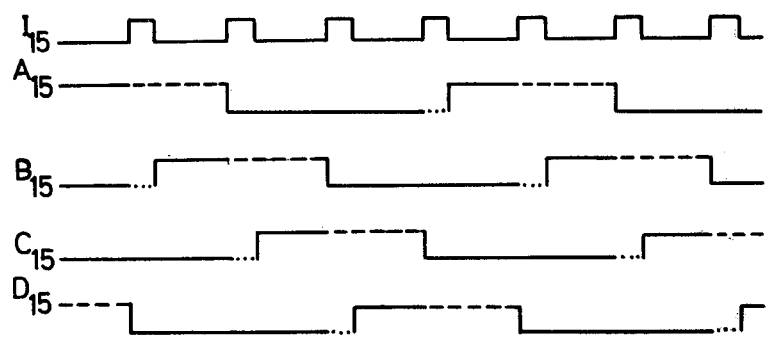
FIG. 16 is a time-chart of the logic signals appearing in the circuit of FIG. 15.

The input signal of this circuit is again formed by short duration, here positive, pulses which are spaced from each other by intervals of unlimited duration. FIG. 16 is a time-chart of the logic signals appearing in the circuit of FIG. 15, namely the input signal $I_{15}$ and the signals corresponding to the internal variables $A_{15}$ to $D_{15}$. The transition table VII shows, as in the preceding examples, the sequence of the states of the circuit and the corresponding conductive conditions of the different transistors. The same symbolism as in the other examples has been used to indicate the states maintained respectively by parasitic capacitances and by dissipating elements. The auxiliary transistors of the groups of n channel transistors are used to maintain the states of the corresponding nodes as a function of the associated control variable.

Figure 17:
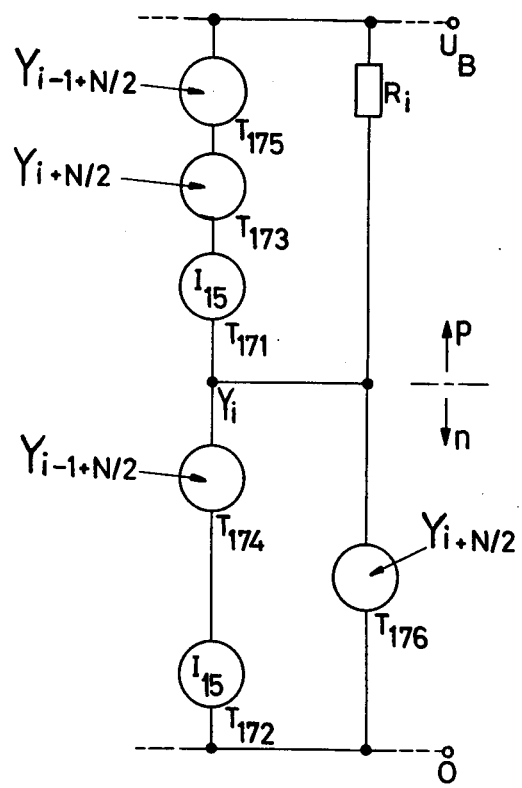
FIG. 17 is the diagram of one cell of a divider by an even number N.

A logic gate or cell of the divider circuit of FIG. 15 can be represented by the general diagram of FIG. 17. By combining an even number N of cells of this type the basic circuit of a divider by that even number N can be built up.

The output node of the cell of FIG. 17 has been designated by $Y_i$ with $i = 1, 2, \ldots, N$. This designation corresponds to that of FIG. 15 as follows: $Y_1 = A_{15}$, $Y_2 = B_{15}$, $Y_3 = C_{15}$ and $Y_4 = D_{15}$. Each group of transistors is composed of three transistors of the same type namely $T_{171}$, $T_{173}$ and $T_{175}$ of p channel type and $T_{172}$, $T_{174}$ and $T_{176}$ of n channel type. The control variables of these transistors are shown in the diagram of FIG. 17. It is to be noted that if the index obtained by introducing given values for i and N exceeds N, the number N is to be subtracted to obtain the actual index. For example if $i = 4$ and $N = 4$, $i + N/2 = 6$ and the actual index to be used is $6 - 4 = 2$.

Each cell further comprises a dissipating element, called $R_i$, corresponding to the dissipating elements such as $R_{151}$ of FIG. 15.

Table VII
CONDUCTION STATES OF THE TRANSISTORS

Figure 18:
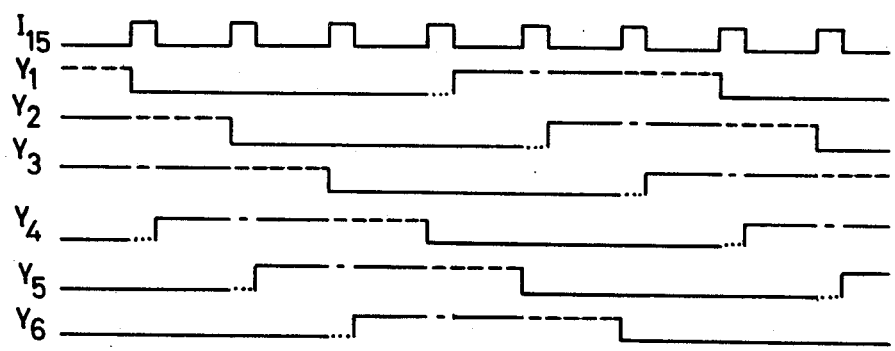
FIG. 18 is a diagram of the logic signals appearing in a divider by six built up of cells according to FIG. 17.

FIG. 18 shows by way of example, the logic signals appearing in a divider by six composed of $N = 6$ cells according to FIG. 17. The input signal $I_{15}$ is the same as in the case of circuit of FIG. 15 and the internal variables have been designated in accordance with the nomenclature of FIG. 17 by $Y_1$ to $Y_6$. Table VIII shows the successive states of this circuit as well as the conduction conditions of the transistors of the cell 2 ($i = 2$), the only case represented to simplify the table.

A divider by N made as described above from cells according to FIG. 17 comprises 6 N transistors and N dissipating elements.

Figure 19:
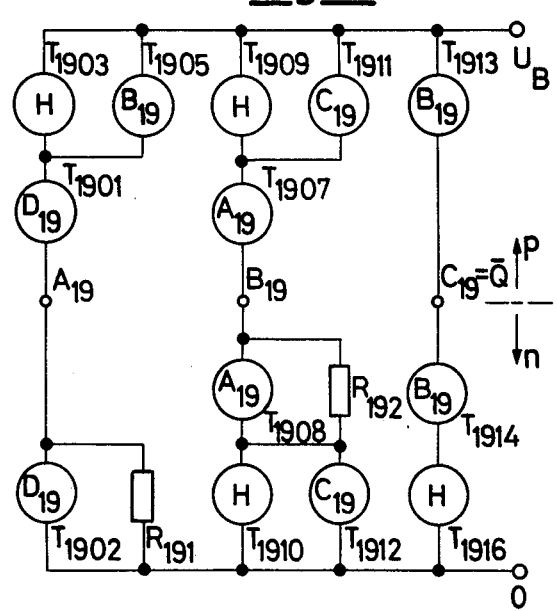
FIG. 19 is the diagram of a D flip-flop cell.

FIG. 19 shows another example of a logic circuit using dissipating elements for obtaining a semi-dynamic behaviour, namely a D flip-flop circuit which is derived from a dynamic circuit such as described in the U.S. patent application Ser. No. 613,919 (Swiss patent application No. 12 557/74). This circuit comprises three logic gates the output nodes of which are designated respectively by $A_{19}$, $B_{19}$ and $C_{19}$ and which provide internal variables of the same name. The transistors the conduction pathes of which are connected between these nodes and the positive terminal ($U_B$) of the power supply are as formerly p channel MOS transistors, while those connected between the nodes and the negative terminal (0) are of the n channel type. The circuit comprises two dissipating elements $R_{191}$ and $R_{192}$ connected respectively between the node $A_{19}$ and 0 and in parallel to a part ($T_{1908}$) of the n channel transistor group connected to node $B_{19}$.

The input variables of the circuit are a clock signal H constituted by short negative pulses (value 0) with respect to the level 1, the 1 states having any desired duration, and a further input variable $D_{19}$. The behaviour of such circuit with two entries cannot be explained conveniently by a transition table and it is therefore preferable to use the generally known representation by a flow table as described for example in the book of Stephen H. Unger "Asynchronous Sequential Switching Circuits", Wiley-Interscience, New York 1969, ch. 1.1. Table IX shows the different states of the circuit characterized by the input states $D_{19}H$ and the internal states $A_{19}$, $B_{19}$, $C_{19}$, the output states $\bar{Q}$ being those of the variable $C_{19}$. As there are four possible input states $D_{19}H$ and the three internal variables can define 8 different states, there are in total four by eight possible states for this circuit. Each of these states has been entered as a "next internal state" in the matrix bordered by a broad line in table IX, at the cross-point of the corresponding input state row and the corresponding present internal state line.

When the present internal state and the next internal state are identical the state is a stable one. The same symbolism as in the preceding tables has been used to characterize the stable state of the circuit and the manner in which the state of a variable is maintained. It is to be noted that due to the wave form of the clock signal H only those states where $H = 1$ can have a long duration.

TABLE VIII

| STATES | | | | | | | CONDUCTION STATES OF THE TRANSISTORS (cell 2) | | | | | |
|---|---|---|---|---|---|---|---|---|---|---|---|---|
| $I_{15}$ | $Y_1$ | $Y_2$ | $Y_3$ | $Y_4$ | $Y_5$ | $Y_6$ | 171 | 173 | 175 | 172 | 174 | 176 |
| 0 | 1 | 1 | 1 | 0 | 0 | 0 | 1 | 1 | 1 | 0 | 0 | 0 |
| 1 | (1) | 1 | 1 | 0 | 0 | 0 | 0 | 1 | 1 | 1 | 0 | 0 |
| 1 | 0 | 1 | 1 | 0 | 0 | 0 | 0 | 1 | 1 | 1 | 0 | 0 |
| 0 | 0 | 1 | 1 | (0) | 0 | 0 | 1 | 1 | 1 | 0 | 0 | 0 |
| 0 | 0 | 1 | 1 | 1 | 0 | 0 | 1 | 0 | 1 | 0 | 1 | 0 |
| 1 | 0 | (1) | 1 | 1 | 0 | 0 | 0 | 0 | 1 | 1 | 1 | 0 |
| 1 | 0 | 0 | 1 | 1 | 0 | 0 | 0 | 0 | 1 | 1 | 1 | 0 |
| 0 | 0 | 0 | 1 | 1 | (0) | 0 | 1 | 0 | 1 | 0 | 1 | 0 |
| 0 | 0 | 0 | 1 | 1 | 1 | 0 | 1 | 0 | 0 | 0 | 1 | 1 |
| 1 | 0 | 0 | (1) | 1 | 1 | 0 | 0 | 0 | 0 | 1 | 1 | 1 |
| 1 | 0 | 0 | 0 | 1 | 1 | 0 | 0 | 0 | 0 | 1 | 1 | 1 |
| 0 | 0 | 0 | 0 | 1 | 1 | (0) | 1 | 0 | 0 | 0 | 1 | 1 |
| 0 | 0 | 0 | 0 | 1 | 1 | 1 | 1 | 0 | 0 | 0 | 1 | 1 |
| 1 | 0 | 0 | 0 | (1) | 1 | 1 | 0 | 0 | 0 | 1 | 1 | 1 |
| 1 | 0 | 0 | 0 | 0 | 1 | 1 | 0 | 1 | 0 | 1 | 0 | 1 |
| 0 | (0) | 0 | 0 | 0 | 1 | 1 | 1 | 1 | 0 | 0 | 0 | 1 |
| 0 | 1 | 0 | 0 | 0 | 1 | 1 | 1 | 1 | 0 | 0 | 0 | 1 |
| 1 | 1 | 0 | 0 | 0 | (1) | 1 | 0 | 1 | 0 | 1 | 0 | 1 |
| 1 | 1 | 0 | 0 | 0 | 0 | 1 | 0 | 1 | 1 | 1 | 0 | 0 |
| 0 | 1 | (0) | 0 | 0 | 0 | 1 | 1 | 1 | 1 | 0 | 0 | 0 |
| 0 | 1 | 1 | 0 | 0 | 0 | 1 | 1 | 1 | 1 | 0 | 0 | 0 |
| 1 | 1 | 1 | 0 | 0 | 0 | (1) | 0 | 1 | 1 | 1 | 0 | 0 |
| 1 | 1 | 1 | 0 | 0 | 0 | 0 | 0 | 1 | 1 | 1 | 0 | 0 |
| 0 | 1 | 1 | (0) | 0 | 0 | 0 | 1 | 1 | 1 | 0 | 0 | 0 |
| 0 | 1 | 1 | 1 | 0 | 0 | 0 | 1 | 1 | 1 | 0 | 0 | 0 |

Table IX

| | | | | INPUT STATES $D_{19}H$ | | | | | |
|---|---|---|---|---|---|---|---|---|---|
| | $A_{19}$ | $B_{19}$ | $C_{19}$ | 0 0 | 0 1 | 1 1 | 1 0 | $\bar{Q}$ | |
| present internal states | 1 | 0 | 1 | 1 0 1 | 1 0 1 | 0 0 1 | 0 0 1 | 1 | output states |
| | | | | 1 0 1 | | | | | |
| | 0 | 0 | 1 | ⎡ 1 1 1 ⎤ | 1 0 1 | 0 0 1 | 0 1 1 | 1 | |
| | | | | ⎣ 0 1 1 ⎦ | | | | | |
| | 0 | 1 | 1 | 1 1 1 | 0 1 0 | 0 1 0 | 0 1 1 | 1 | |
| | 0 | 1 | 0 | 1 1 0 | 0 1 0 | 0 1 0 | 0 1 0 | 0 | |
| | | | | | | 1 0 0 | | | |
| | 1 | 1 | 0 | 1 1 0 | 1 0 0 | ⎡ 0 0 0 ⎤ | 0 1 0 | 0 | |
| | | | | | | ⎣ 0 1 0 ⎦ | | | |
| | 1 | 0 | 0 | — | 1 0 1 | 0 0 1 | — | 0 | |
| | 1 | 1 | 1 | 1 0 1 | — | — | — | 1 | |
| | 0 | 0 | 0 | — | — | 0 1 1 | — | — | |
| | | | | | next internal states | | | | |

Considering for instance the state $D_{19}H/A_{19}B_{19}C_{19}$ = 00/101, the next internal state is the same and therefore this state is stable. If $D_{19}$ goes over to 1, the circuit passes through the instable internal state 10/001 and then takes the stable state 10/011. The table shows that some of the states (for instance 00/001) can lead to a plurality of different states. The dashes in the table correspond to states which are impossible in a normal operation mode. The conduction condition of the transistors has not been represented but can be easily determined from the diagram of FIG. 19 as the conduction condition corresponds to the state of the control variable in as far as the n channel transistors are concerned and corresponds to the inverse of the control variable for the p channel transistors. The dissipating element $R_{191}$ maintains the variable $A_{19}$ at 0 during the long stable state 01/010, and the dissipating element $R_{192}$ maintains $B_{19}$ at 0 during the long stable state 11/001.

It can be seen that the variable $B_{19}$ is equal to the inverted variable $C_{19}$, $B_{19} = \overline{C_{19}}$, during the intervals between the clock pulses ($H = 1$). As the clock pulses $H = 0$ are short, $B_{19}$ can be used as an output variable and a shift register circuit can be realized by combining a number of cells of the same type, as shown in FIG. 20.

Figure 20:
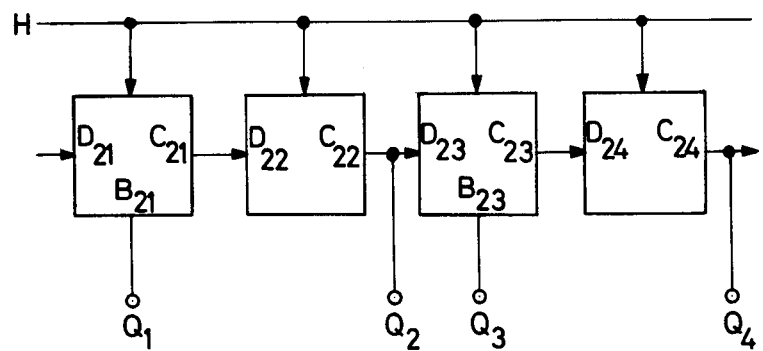
FIG. 20 is a diagram of a shift register made with the circuit of FIG. 19.

In FIG. 20 the variables corresponding to the variables $D_{19}$, $B_{19}$ and $C_{19}$ of the cell of FIG. 19 are designated by the indices 21, 22, 23 and 24 (in place of the index 19) inside the four corresponding cells. The input signal H is the same as in the case of FIG. 19 and the output signals of the register which are designated by $Q_1$ to $Q_4$, are taken as shown in FIG. 20.

Figure 21:
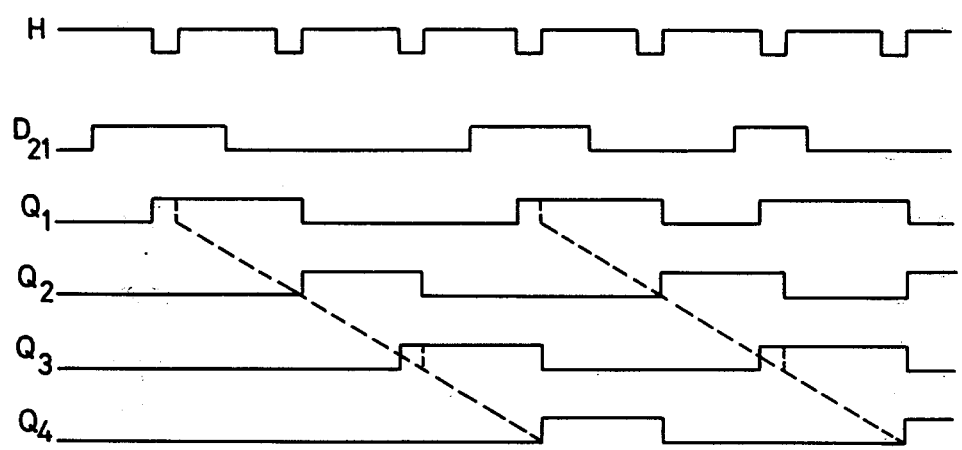
FIG. 21 is a time-chart of the logic input and output signals of the shift register according to FIG. 20.

FIG. 21 is a time-chart of the input signals H and $D_{21}$ and of the output signals $Q_1$ to $Q_4$ which illustrate the operation of the circuit. It is to be noted that when using the cells in accordance with FIG. 20, the transistor corresponding to transistor $T_{1912}$ of FIG. 19 can be eliminated in each cell due to the fact that the variables $D_{22}$ to $D_{24}$ after having taken the level 1 return to 0 before the occurrance of a clock pulse H.

The various examples of the present logic circuit show that it is possible, by adding dissipating elements and if necessary a very small number of auxiliary transistors which do not participate in the commutations, to provide a static or semi-dynamic behaviour in logic circuits of the dynamic type and therefore to combine to a large extent the structural advantages of the dynamic circuits with the operational advantages of the static cicuits.

We claim:

1. A frequency divider for dividing by two the repetition frequency f of input pulses having a duration of about 1 to 1000 μsec, comprising first, second and third logic gates, connected in parallel between the terminals of a power supply, each gate comprising at least one p channel MOS transistors and at least one n channel MOS transistors having each a controllable conduction path and a control gate, the conduction paths of said at least one p and n channel transistors having a common connection point which represents an output node of said gate and the potential of which defines an output variable of said gate, the divider further comprising means for applying a control variable represented either by one of said output variables or the input pulses to the control gate of said transistors thereby controlling the same by bringing the conduction path thereof in the conductive or in the non conductive state depending on the condition of said control variable, the first logic gate comprising a first p channel transistor ($T_{601}$) controlled by the said input pulses ($I_{61}$) and having its conduction path connected in series with that of first and second n channel transistors ($T_{602}$, $T_{603}$), which first and second n channel transistors are controlled respectively by the said input pulses ($I_{61}$) and by the output variable ($C_{61}$) provided by said third logic gate, the second logic gate comprising a second p channel transistor ($T_{604}$) controlled by the output variable ($A_{61}$) provided by said first logic gate, a power dissipating element ($R_{61}$) being coupled in parallel with the conduction path of said second p channel transistor, third and fourth n channel transistors ($T_{606}$, $T_{610}$) the conduction paths of which are coupled in parallel to each other and in series with that of the second p channel transistor and which are controlled respectively by the said input pulses ($I_{61}$) and by the variable ($C_{61}$) provided by said third logic gate, and a fifth n channel transistor ($T_{605}$) controlled by the variable ($A_{61}$) provided by said first logic gate and having its conduction path connected in series with that of the third and fourth n channel transistors, the third logic gate comprising third and fourth p channel transistors ($T_{607}$, $T_{608}$) having their conduction paths connected in series and being controlled respectively by said input pulses ($I_{61}$) and by the output variable ($B_{61}$) provided by the second logic gate, and a sixth n channel transistor ($T_{609}$) having its conduction path connected in series with that of the third and fourth p channel transistors and being controlled by the output variable provided by the second logic gate, so that the output node ($A_{61}$) of the first logic gate provides pulses of the same duration as the input pulses, with an inversed polarity and with a frequency of f/2.

2. A frequency divider for dividing by two the repetition frequency f of input pulses having a duration of approximately 1 to 1000 μsec, comprising first, second and third logic gates connected in parallel between the terminals of a power supply, each gate comprising at least one p channel MOS transistors and at least one n channel MOS transistors having each a controllable conduction path and a control gate, the conduction path of said at least one p and n channel transistors having a common connection point which represents an output node of said gate and the potential of which defines an output variable of said gate, the divider further comprising means for applying a control variable represented either by one of said output variables or the input pulses to the control gate of said transistors thereby controlling the same by bringing the conduction path thereof in the conductive or in the non conductive state depending on the condition of said control variable, the first logic gate comprising first and second p channel transistors ($T_{834}$, $T_{835}$) controlled by the output variables ($B_{81}$, $C_{81}$) provided by the second and third logic gates respectively, said transistors having their conduction paths connected in series, and a third p channel transistor ($T_{825}$) controlled by the input pulses ($I_{81}$), said third p channel transistor having its conduction path connected in parallel with the series connection of those of the first and second p channel transistors, said first gate further comprising first and second n channel transistors ($T_{826}$, $T_{827}$) the conduction paths of which are connected in series and which are controlled by the input pulses ($I_{81}$) and by the output variable ($T_{81}$) provided by the third logic gate, respectively, and a first dissipating element ($R_{83}$) connected between the output node ($A_{81}$) of said first logic gate and the negative terminal (0) of the power supply, said second logic gate comprising a fourth p channel transistor ($T_{828}$) controlled by the output variable ($A_{81}$) provided by said first logic gate and third and fourth n channel transistors ($T_{829}$, $T_{830}$) having their conduction paths connected in series and being controlled by the output variable ($A_{81}$) provided by said first logic gate and by the input pulses, respectively, said third logic gate comprising fifth and sixth p channel transistors ($T_{831}$, $T_{832}$) having their conduction paths connected in series and being controlled by the input pulses ($I_{81}$) and by the output variable ($B_{81}$) provided by the second logic gate, respectively, and comprising a fifth n channel transistor ($T_{833}$) controlled by the output variable ($B_{81}$) provided by said second logic gate, and a second dissipating element ($R_{84}$) coupled in parallel with said fifth n channel transistor, so that the output node ($C_{81}$) of said third logic gate provides output pulses of the same duration as the input pulses, of inversed polarity and of a frequency of f/2.

3. A binary divider stage of a purely static behaviour for dividing by two the alternations of an input signal, comprising first, second and third logic gates, connected in parallel between the terminals of a power supply, each gate comprising at least one p channel MOS transistors and at least one n channel MOS transistors having each a controllable conduction path and a control gate, the conduction paths of said at least one p and n channel transistors having a common connection point which represents an output node of said gate and the potential of which defines an output variable of said gate, the divider further comprising means for applying a control variable represented either by one of said output variables or the input signal to the control gate of said transistors thereby controlling the same by bringing the conduction path thereof in the conductive or in the non conductive state depending on the condition of said control variable, the first logic gate comprising first, second and third p channel transistors, the first of which ($T_{901}$) is controlled by the input signal ($I_9$) and has its conduction path coupled in parallel with the series connection of the conduction paths of said second and third transistors ($T_{934}$, $T_{935}$) which are controlled, respectively, by the output variables ($B_9$, $C_9$) provided by the said second and third logic gates, said first logic gate further comprising first and second n channel transistors ($T_{902}$, $T_{903}$) the conduction paths of which are connected in series and which are controlled, respectively, by the output variable ($C_9$) provided by the third logic gate and by the input signal ($I_9$), and a first dissipating element ($R_{93}$) coupled in parallel to the series connection of said first and second n channel transistors, said second logic gate comprising a fourth p channel transistor ($T_{904}$) controlled by the output variable provided by the first logic gate and a second dissipating element ($R_{91}$) coupled in parallel with the conduction path of said fourth p channel transistor, said second logic gate further comprising third and fourth n channel transistors ($T_{905}$, $T_{906}$) having their conduction paths connected in series and being controlled, respectively, by the output variable ($A_9$) provided by the first logic gate and by the input signal ($I_9$), and a fifth n channel transistor ($T_{910}$) having its conduction path coupled in parallel to the series connection of that of the third and fourth n channel transistors and being controlled by the output variable ($C_9$) provided by the third logic gate, said third logic gate comprising fifth and sixth p channel transistors ($T_{907}$, $T_{908}$) having their conduction paths connected in series and being controlled, respectively, by the input signal ($I_9$) and by the output variable ($B_9$) provided by the second logic gate and further comprising a sixth n channel transistor ($T_{909}$) controlled by the output variable ($B_9$) provided by the second logic gate and a third dissipating element ($R_{95}$) coupled in parallel with the conduction path of the sixth n channel transistor, the divided output signals being taken out of the output node ($C_9$) of said third logic gate.

4. A frequency divider of small power consumption, for dividing by two the repetition frequency of input pulses having a duration of approximately 1 to 1000 μsec, comprising first, second and third logic gates, connected in parallel between the terminals of a power supply, each gate comprising at least one p channel MOS transistors and at least one n channel MOS transistors having each a controllable conduction path and a control gate, the conduction paths of said at least one p and n channel transistors having a common connection point which represents an output node of said gate and the potential of which defines output variable of said gate, the divider further comprising means for applying a control variable represented either by one of said output variables or the input pulses to the control gate of said transistors thereby controlling the same by bringing the conduction path thereof in the conductive or in the non conductive state depending on the condition of said control variable, the first logic gate comprising a first p channel transistor ($T_{1001}$) controlled by the input pulses ($I_{10}$) and first and second n channel transistors ($T_{1002}$, $T_{1003}$) having their conduction paths connected in series with that of said first p channel transistors, and being controlled, respectively, by the input pulses and by the output variable ($C_{10}$) provided by said third logic gate, the second logic gate comprising a second p channel transistor ($T_{1004}$) and third and fourth n channel transistors ($T_{1005}$, $T_{1006}$) having their conduction paths connected in series and being controlled, respectively, by the input pulses ($I_{10}$) and by the output variable ($A_{10}$) provided by said first logic gate, said third logic gate comprising third and fourth p channel transistors ($T_{1007}$, $T_{1008}$) having their conduction pathes connected in series and being controlled, respectively, by the input pulses and by the output variable ($B_{10}$) provided by the second logic gate and a fifth n channel transistor ($T_{1009}$) having its conduction path connected in series with that of the third and fourth p channel transistors and that of said fourth n channel transistor, the said fifth n channel transistor being controlled by the output variable ($B_{10}$) provided by the second logic gate, the divider further comprising a dissipating element ($R_{10}$) and first and second auxiliary transistors ($T_{1010}$, $T_{1011}$) being respectively of the p and n channel type and having their conduction paths connected in series between the positive and negative terminals of the power supply, said auxiliary transistors being controlled each by the variable ($C_{10}$) provided by said third logic gate, the dissipating element being connected between the output node of said second logic gate and the common connection point of said auxiliary transistors, the output node ($A_{10}$) of said first logic gate providing pulses of the same duration as the input pulses, of inversed polarity and of a frequency of f/2.

5. A frequency divider as claimed in claim 4, wherein said auxiliary transistors have a small gain and said dissipating element is replaced by a mere connection.

6. A frequency divider as claimed in claim 5 constituting a binary stage of a divider by a multiple of two comprising a sixth p channel transistor ($T_{1012}$) having its conduction path connected in series with that of said fourth n channel transistor ($T_{1006}$) and being controlled by the output variable ($A_{10}$) provided by said first logic gate, the common connection point ($E_{10}$) of said sixth p channel and fourth n channel transistors providing pulses of the same duration and polarity as the input pulses and having a frequency of f/2.

7. A frequency divider as claimed in claim 4 constituting a binary stage of a divider by a multiple of two, comprising a sixth p channel transistor ($T_{1012}$) having its conduction path connected in series with that of said fourth n channel transistor ($T_{1006}$) and being controlled by the output variable ($A_{10}$) provided by said first logic gate, the common connection point ($E_{10}$) of said sixth p channel and fourth n channel transistors providing pulses of the same duration and polarity as the input pulses and having a frequency of f/2.

8. A frequency divider including a CMOS transistor logic circuit comprising at least one gate circuit formed by a first set of at least one n channel MOS transistor and a second set of at least one p channel MOS transistor, each transistor having a controllable conduction path and a control gate, said first and second sets of transistors having a common connection point defining an output node of the gate circuit, said first and second sets of transistors being further connected to the negative and positive terminals of a power supply means, respectively, means for coupling to the control gate of each of the said MOS transistors a logic control variable represented by a potential capable of taking two predetermined values for driving the respective transistor to a conductive or a non conductive state, respectively, the conductive state of each of the said first and second sets of transistors defining the potential at said output node which represents the output variable of the gate circuit, said logic control variable being either the said output variable or a variable of the pulse frequency to be divided, and at least one combination of the said logic control variables leading to simultaneous non conduction of said first and second sets of transistors, said logic gate circuit comprising a power dissipating element coupled in parallel with at least a part of at least one of the said sets of transistors for at least one combination of the control variables to define at least temporarily a conduction path between the output node of the gate circuit and one terminal of the power supply means, the resistance of the dissipating element being high with respect to that of a MOS transistor in its conductive state but less than $V_{Tmin}/I_{fmax}$, $V_{Tmin}$ being the minimum threshold voltage of the transistors and $I_f$ max being the maximum leakage current at the considered output node, so that the potential of the said node is substantially equal to that of the said power supply terminal during the time interval in which both said first and second sets of transistors of the gate circuit are in the non conductive state.

9. A frequency divider as claimed in claim 8, wherein the set of transistors opposite to the set to which the dissipating element is coupled comprises at least one auxiliary transistor having a controllable conduction path and a control gate, and means for applying a control variable to the control gate of said auxiliary transistor to establish for a given duration a conduction path between the output node of the logic gate and the terminal of the power supply corresponding to the set of transistors comprising the auxiliary transistor, the resistance of the said conduction path being substantially less than that of the dissipating element.

10. A frequency divider as claimed in claim 8, wherein the gate circuit comprises at least one auxiliary transistor having a controllable conduction path and a control gate, and means for applying a control variable to the control gate of said auxiliary transistor for connecting said dissipating element through the conduction path of said auxiliary transistor in parallel with at least a part of one of the said sets of transistors.

11. A frequency divider as claimed in claim 8, wherein the gate circuit comprises at least two auxiliary transistors each having a controllable conduction path and a control gate, and means for applying control variables to the control gates of each of the said auxiliary transistors for selectively connecting said dissipating element through the conduction path of either one of said auxiliary transistors in parallel with at least a corresponding part of either one of said sets of transistors.

12. A frequency divider as claimed in claim 8, wherein the dissipating element is a resistor made of weakly doped polysilicon.

13. A frequency divider as claimed in claim 8, wherein the dissipating element is a diode formed by a pn junction between two strongly doped layers of polysilicon.

14. A frequency divider as claimed in claim 8, wherein the dissipating element is a diode formed by a pn junction between two strongly doped portions of a monocrystalline silicon wafer.

15. A frequency divider as claimed in claim 8, wherein the dissipating element is a small gain MOS transistor being at least temporarily biased in the conductive direction by the power supply.

16. A frequency divider as claimed in claim 8, wherein the dissipating element is a MOS transistor being biased to operate as a current source by a voltage of a value less than that of the power supply.

17. A frequency divider as claimed in claim 8, wherein the dissipating element is a depletion type transistor the gate of which is connected to its source.

18. A frequency divider comprising an uneven number N of logic gates connected in parallel between the positive and negative terminals of a power supply, for dividing by said uneven number N the repetition frequency f of positive input pulses having a duration of approximately 1 to 1000 $\mu$sec, each logic gate comprising first and second p channel MOS transistors ($T_{141}$, $T_{143}$) and first, second and third n channel MOS transistors ($T_{144}$, $T_{142}$, $T_{146}$) having each a controllable conduction path and a control gate, the conduction paths of said first and second p channel and of said first and second n channel transistors being connected in series between the said terminals of the power supply, and the conduction paths of the said second p channel and said first n channel transistors having a common connection point ($X_i$) representing an output node of said gate the potential of which defines an output variable ($X_i$) of said logic gate, said third n channel transistor having its conduction path coupled in parallel to that of said second n channel transistor, each gate further comprising a dissipative element ($R_{14}$) coupled in parallel to the conduction path of said first p channel transistor, the divider further comprising means for applying the input pulses to be divided ($I_{12}$) to the control gates of said second p channel and said second n channel transistors, means for applying the output variable ($X_{i-1}$) provided by the logic gate preceding a considered logic gate to the control gates of said first p channel and said first n channel transistors and means for applying the output variable ($X_{i+1}$) provided by the logic gate following a considered logic gate to the control gate of said third n channel transistors, the first logic gate of the circuit being considered as the gate following the N-th gate of the divider, the output variable ($X_N$) of the N-th logic gate providing output pulses of a frequency of f/N.

19. A frequency divider comprising an even number N of logic gates connected in parallel between the terminals of a power supply, for dividing by said even number N the repetition frequency f of input pulses having a duration of approximately 1 to 1000 µsec, each logic gate comprising first, second and third p channel MOS transistors ($T_{171}$, $T_{173}$, $T_{175}$) and first, second and third n channel MOS transistors ($T_{174}$, $T_{172}$, $T_{176}$) having each a controllable conduction path and a control gate, the conduction paths of said first, second and third p channel transistors and of said first and second n channel transistors being connected in series between said terminals of the power supply, and the conduction paths of said third p channel and said first n channel transistors having a common connection point ($Y_i$) representing an output node of said logic gate the potential of which defines an output variable ($Y_i$) of said gate, said third n channel transistor having its conduction path coupled in parallel to that of said first and second n channel transistors, each gate further comprising a dissipative element ($R_i$) coupled in parallel to the conduction paths of said p channel transistors, the divider further comprising means for applying the input pulses to be divided ($I_{15}$) to the control gates of said third p channel and said second n channel transistors, means for applying the output variable ($Y_{i-1+N/2}$) of the logic gate of rank i−1+N/2) of the logic gate of rank i−1+N2 to the control gates of said first p channel and said first n channel transistors, and means for applying the output variable ($Y_{i+N/2}$) of the logic gate of rank i + N/2 to the control gates of said second p channel and said third n channel transistors, with the rule that if the numbers i + N/2 or i − 1 + N/2 become greater than N, these numbers are diminished by N for obtaining the rank of the considered logic gate of the divider, the output variable ($Y_N$) of the logic gate of rank N providing output pulses of a frequency of f/N.

* * * * *